United States Patent
Takagi et al.

(10) Patent No.: US 8,179,714 B2
(45) Date of Patent: May 15, 2012

(54) NONVOLATILE STORAGE DEVICE AND METHOD FOR WRITING INTO MEMORY CELL OF THE SAME

(75) Inventors: Takeshi Takagi, Kyoto (JP); Shunsaku Muraoka, Osaka (JP); Mitsuteru Iijima, Osaka (JP); Ken Kawai, Osaka (JP); Kazuhiko Shimakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 174 days.

(21) Appl. No.: 12/865,193

(22) PCT Filed: Oct. 16, 2009

(86) PCT No.: PCT/JP2009/005405
§ 371 (c)(1),
(2), (4) Date: Jul. 29, 2010

(87) PCT Pub. No.: WO2010/047068
PCT Pub. Date: Apr. 29, 2010

(65) Prior Publication Data
US 2011/0007553 A1 Jan. 13, 2011

(30) Foreign Application Priority Data

Oct. 21, 2008 (JP) ................................. 2008-270572

(51) Int. Cl.
*G11C 11/00* (2006.01)
(52) U.S. Cl. .............. 365/148; 365/185.18; 365/185.23; 365/185.27; 365/189.16

(58) Field of Classification Search .................. 365/148, 365/189.16, 185.18, 185.23, 185.27
See application file for complete search history.

(56) References Cited

U.S. PATENT DOCUMENTS
5,602,048 A * 2/1997 Komori et al. ................ 438/264
(Continued)

FOREIGN PATENT DOCUMENTS
JP 2004-303340 10/2004
(Continued)

OTHER PUBLICATIONS

International Search Report issued Jan. 26, 2010 in International (PCT) Application No. PCT/JP2009/005405.

*Primary Examiner* — Pho M Luu
(74) *Attorney, Agent, or Firm* — Wenderoth, Lind & Ponack, LLP

(57) ABSTRACT

Provided is a nonvolatile storage device (200) capable of stably operating without increasing a size of a selection transistor included in each of memory cells. The nonvolatile storage device (200) includes: a semiconductor substrate (301) which has a P-type well (301a) of a first conductivity type; a memory cell array (202) which includes memory cells (M11) or the like each of which includes a variable resistance element (R11) and a transistor (N11) that are formed above the semiconductor substrate (301) and connected in series; and a substrate bias circuit (220) which applies, to the P-type well (301a), a bias voltage in a forward direction with respect to a source and a drain of the transistor (N11), when a voltage pulse for writing is applied to the variable resistance element (R11) included in the selected memory cell (M11) or the like.

15 Claims, 18 Drawing Sheets

U.S. PATENT DOCUMENTS

| | | | |
|---|---|---|---|
| 7,212,431 B2 * | 5/2007 | Kang et al ..................... | 365/145 |
| 7,990,754 B2 * | 8/2011 | Azuma et al. ................. | 365/148 |
| 8,053,826 B2 * | 11/2011 | Yonamoto ..................... | 257/324 |
| 8,125,817 B2 * | 2/2012 | Takagi et al. ................. | 365/148 |
| 2004/0252548 A1 | 12/2004 | Tsukamoto et al. | |
| 2004/0264244 A1 | 12/2004 | Morimoto | |
| 2005/0117397 A1 | 6/2005 | Morimoto | |
| 2007/0165442 A1 | 7/2007 | Hosoi et al. | |
| 2007/0217254 A1 | 9/2007 | Matsuoka et al. | |
| 2010/0073983 A1 | 3/2010 | Hosoi | |

FOREIGN PATENT DOCUMENTS

| | | |
|---|---|---|
| JP | 2005-25914 | 1/2005 |
| JP | 2007-4849 | 1/2007 |
| JP | 2007-188603 | 7/2007 |
| JP | 2008-123690 | 5/2008 |
| JP | 2008-198275 | 8/2008 |
| WO | 2004/114315 | 12/2004 |
| WO | 2005/098952 | 10/2005 |
| WO | 2008/041278 | 4/2008 |

* cited by examiner

Fig. 16
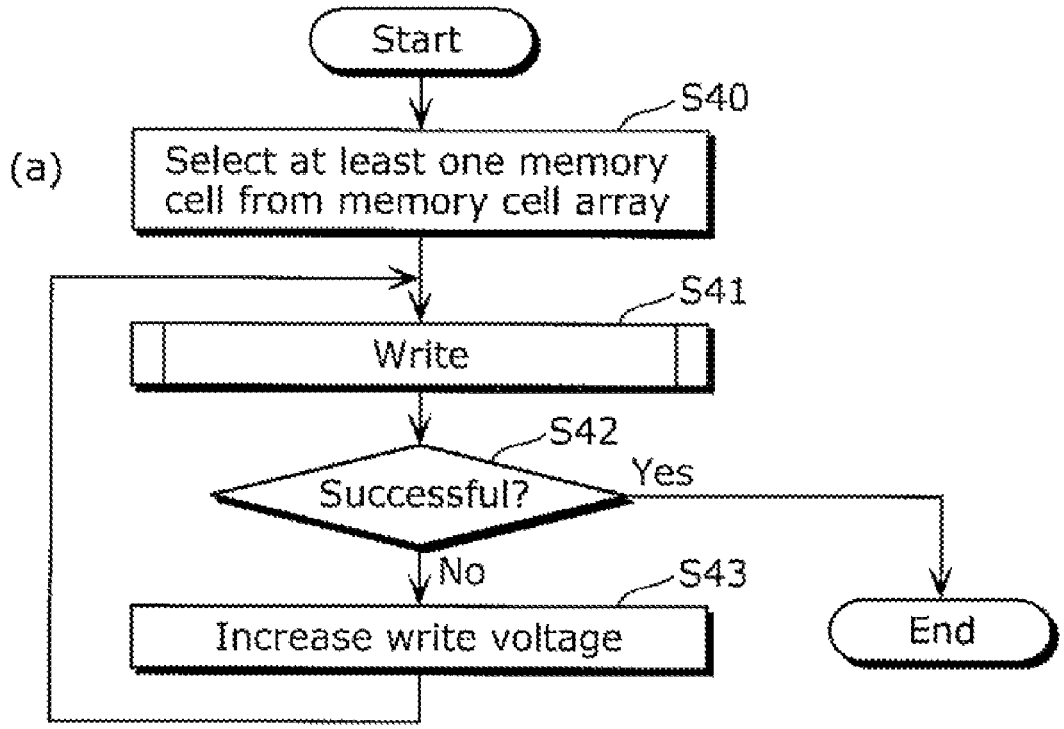
(a)
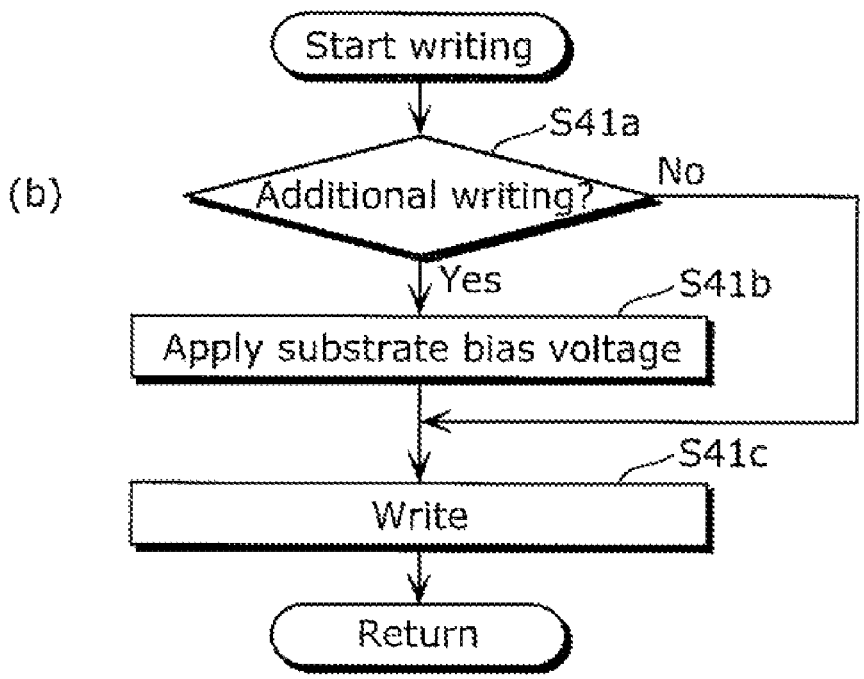
(b)

NONVOLATILE STORAGE DEVICE AND METHOD FOR WRITING INTO MEMORY CELL OF THE SAME

TECHNICAL FIELD

The present invention relates to a nonvolatile storage device having memory cells each of which includes a transistor and a variable resistance element whose resistance value reversibly changes based on electrical signals.

BACKGROUND ART

In recent years, research and development of nonvolatile storage devices having memory cells formed with variable resistance elements has shown rapid. progress. A variable resistance element is an element with a property that its resistance state reversibly changes between a low resistance state and a high resistance state based on electrical signals, and can store information corresponding to the resistance state in a nonvolatile manner.

Commonly known as a nonvolatile storage device that includes variable resistance elements is a nonvolatile storage device which includes memory cells, referred to as 1T1R (1 Transistor 1 Resistor) memory cells, arranged in a matrix at positions at which bit lines intersect with word lines and source lines that are arranged orthogonally to the bit lines. Here, each of the memory cells includes a MOS transistor and a variable resistance element that are connected in series.

Patent Literature 1 discloses a nonvolatile storage device including 1T1R memory cells in which oxides having a perovskite-type crystalline structure are used as variable resistance elements.

FIG. 18 is a schematic cross-sectional view of a conventional memory cell described in Patent Literature 1. A memory cell 1011 includes: a source region 1002 serving as a first diffusion layer region and a drain region 1003 serving as a second diffusion layer region that are formed on a semiconductor substrate 1001; a selection transistor 1006 including a gate electrode 1005 formed on a gate oxide film 1004; and a variable resistance element 1010 formed by having, between a lower electrode 1007 and an upper electrode 1009, a variable resistance material 1008 whose resistance value changes upon voltage application. Here, the drain region 1003 and the lower electrode 1007 that are electronically connected are connected in series via a conductive via. The upper electrode 1009 is connected via the conductive via to a metal line 1012 serving as a bit line, and the source region 1002 is connected via the conductive via to a metal line 1013 serving as a source line. The gate electrode 1005 is connected to a word line. It is to be noted that Patent Literature 1 discloses $Pr_{1-x}Ca_xMnO_3$ (PCMO), $La_{1-x}Sr_xMnO_3$ (LSMO) and so on as the variable resistance material 1008.

In the memory cell 1011 configured as described above, applying a voltage pulse Vpp, a voltage pulse Vss, and a voltage pulse having a predetermined voltage amplitude Vwp to the upper electrode 1009, the source region 1002, and the gate electrode 1005, respectively, changes a resistance state of the variable resistance material 1008 from a low resistance state to a high resistance state, whereas applying the voltage pulse Vss, the voltage pulse Vpp, and a predetermined voltage pulse Vwe to the upper electrode 1009, the source region 1002, and the gate electrode 1005, respectively, changes the resistance state of the variable resistance material 1008 from the high resistance state to the low resistance state.

[Citation List]
[Patent Literature]
 [PTL 1] Japanese Unexamined Patent Application Publication No. 2005-25914

SUMMARY OF INVENTION

Technical Problem

In order for the nonvolatile storage device including such variable resistance elements to stably operate, it is necessary to surely change a resistance value of each of the variable resistance elements. To surely change the resistance value of each variable resistance element, there is a case where it is necessary to temporarily apply a higher voltage than a voltage used in normal writing to the variable resistance element.

As stated above, to apply the voltage higher than the voltage used in normal writing to the variable resistance element, it is conceivable to increase a size of a selection transistor, but the increase is not preferable because it causes inconvenience such as an increase in layout area of a cell.

The present invention has been devised in view of such a situation, and has a main object to provide a nonvolatile storage device capable of stably operating without increasing the size of the selection transistor included in each of memory cells.

Solution to Problem

In order to solve the above problem, a nonvolatile storage device according to an aspect of the present invention includes: a semiconductor substrate which has a region of a first conductivity type; a memory cell array which includes memory cells each of which includes a variable resistance element and a transistor that are connected in series and formed above the semiconductor substrate; a selection circuit which selects, from among the memory cells included in the memory cell array, at least one memory cell by applying a voltage pulse to a gate of the transistor included in the at least one memory cell; a write circuit which applies a voltage pulse Jar writing to the variable resistance element included in the at least one memory cell selected by the selection circuit, via the transistor included in the at least one memory cell; and a substrate bias circuit which applies a first bias voltage to the semiconductor substrate, wherein the variable resistance element included in each of the memory cells includes: a first electrode; a second electrode; and a variable resistance layer which is interposed between the first and second electrodes and whose resistance state reversibly changes between a low resistance state and a high resistance state based on a voltage pulse applied between the first and second electrodes, the transistor included in each of the memory cells is formed within the region of the first conductivity type of the semiconductor substrate, and includes: a first diffusion region of a second conductivity type; the gate; and a second diffusion region of the second conductivity type, the second conductivity type having a polarity which is reverse to a polarity of the first conductivity type, and the substrate bias circuit applies, to the region of the first conductivity type of the semiconductor substrate, the first bias voltage in a forward direction with respect to the first and second diffusion regions, when the write circuit applies the voltage pulse for writing between the first and second electrodes included in the variable resistance element included in the at least one memory cell selected by the selection circuit.

With this, a bias voltage is applied, when writing into a memory cell, to a substrate of a selection transistor included in the memory cell in a forward direction with respect to the selection transistor, and thus a substrate bias effect reduces on-resistance of the selection transistor and causes a large voltage corresponding to the reduction to be applied to a variable resistance element accordingly. As a result, it is possible to surely change a resistance value of the variable resistance element without increasing a gate width of a selection transistor included in each memory cell. It is to be noted that the present invention can be realized not only as the nonvolatile storage device but also as a method for writing into memory cells in the nonvolatile storage device.

Advantageous Effects of Invention

The nonvolatile storage device according to the present invention makes it possible for the resistance value of the variable resistance element to surely change without increasing the size of the selection transistor included in the memory cell, and thus can stably operate.

Therefore, it is possible to further integrate nonvolatile storage devices, and the practical implication of the present invention is quite significant.

BRIEF DESCRIPTION OF DRAWINGS

FIG. 16(a) is a flowchart showing an operation example of a nonvolatile storage device according to Embodiment 5 of the present invention, and FIG. 16(b) is a flowchart showing a detailed procedure of a writing step (S41) in FIG. 16(a).

DESCRIPTION OF EMBODIMENT

Figure 1:
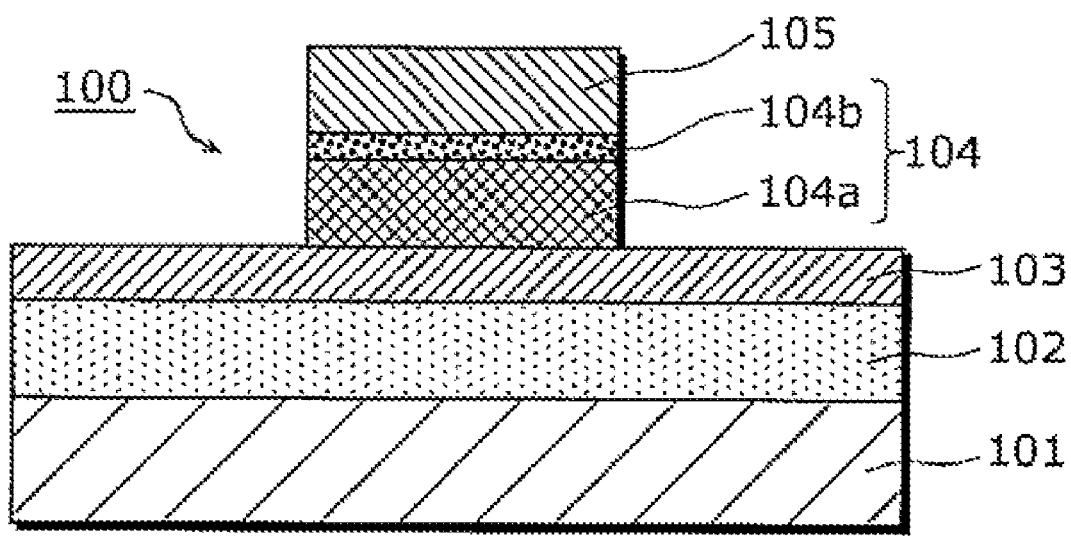
FIG. 1 is a cross-sectional view of a configuration of a variable resistance element included in a nonvolatile storage device in Embodiment 1 of the present invention.

A nonvolatile storage device according to an aspect of the present invention includes: a semiconductor substrate which has a region of a first conductivity type; a memory cell array which includes memory cells each of which includes a variable resistance element and a transistor that are connected in series and formed above the semiconductor substrate; a selection circuit which selects, from among the memory cells included in the memory cell array, at least one memory cell by applying a voltage pulse to a gate of the transistor included in the at least one memory cell; a write circuit which applies a voltage pulse for writing to the variable resistance element included in the at least one memory cell selected by the selection circuit, via the transistor included in the at least one memory cell; and a substrate bias circuit which applies a first bias voltage to the semiconductor substrate, wherein the variable resistance element included in each of the memory cells includes: a first electrode; a second electrode; and a variable resistance layer which is interposed between the first and second electrodes and whose resistance state reversibly changes between a low resistance state and a high resistance state based on a voltage pulse applied between the first and second electrodes, the transistor included in each of the memory cells is formed within the region of the first conductivity type of the semiconductor substrate, and includes: a first diffusion region of a second conductivity type; the gate; and a second diffusion region of the second conductivity type, the second conductivity type having a polarity which is reverse to a polarity of the first conductivity type, and the substrate bias circuit applies, to the region of the first conductivity type of the semiconductor substrate, the first bias voltage in a forward direction with respect to the first and second diffusion regions, when the write circuit applies the voltage pulse for writing between the first and second electrodes included in the variable resistance element included in the at least one memory cell selected by the selection circuit. With this, a bias voltage is applied, when writing into a memory cell, to a substrate of a selection transistor included in the memory cell in a forward direction with respect to the selection transistor, and thus a substrate bias effect reduces on-resistance of the selection transistor and causes a large voltage corresponding to the reduction to be applied to a variable resistance element. As a result, it is possible to surely change a resistance value of the variable resistance element without increasing a gate width of a selection transistor included in each memory cell.

It is to be noted that in the present description, the phrases "writing into a nonvolatile storage device" and "writing into a memory cell" or simply the term "writing" strictly means writing into a variable resistance element included in a memory cell (including both a transition from a low resistance state to a high resistance state and a transition from the high resistance state to the low resistance state). A "selection transistor" is simply referred to as a "transistor". For magnitude of a bias voltage, a voltage may be lower than a threshold voltage with which a current flows from a connected P-type semiconductor to an N-type semiconductor.

Here, the substrate bias circuit may apply the first bias voltage in the case where a resistance value of the variable resistance layer is an initial resistance value that is a resistance value when a voltage pulse has not yet been applied since the variable resistance element is manufactured, the variable resistance layer being included in the variable resistance element included in the at least one memory cell selected by the selection circuit. Stated differently, the present invention may be limited to a case where a memory cell is initialized, as writing into the memory cell in which a substrate bias voltage is applied. With this, in an initialization process for which a voltage larger than a voltage in normal writing is required, the substrate bias effect reduces the on-resistance of the selection transistor and causes the large voltage corresponding to the reduction to be applied to the variable resistance element, and thus the initialization process is more surely performed.

Here, the substrate bias circuit may apply the first bias voltage in the case where the resistance state of the variable resistance layer is changed from the low resistance state to the high resistance state, the variable resistance layer being included in the variable resistance element included in the at least one memory cell selected by the selection circuit. To put it differently, the present invention may be limited to a case where the resistance state of the variable resistance element is changed from the low resistance state to the high resistance state (that is, "high resistance writing", or "HR writing", for short), as the writing into the memory cell in which the substrate bias voltage is applied. With this, in the HR writing, the substrate bias effect reduces the on-resistance of the selection transistor and causes the large voltage corresponding to the reduction to be applied to the variable resistance element, and thus suppressed is variation in the resistance value of the variable resistance element in the high resistance state that is unstable in comparison to the low resistant state.

Here, the substrate bias circuit may apply the first bias voltage in the case where additional writing is performed on the variable resistance element after writing for changing the resistance state of the variable resistance layer is unsuccessful, the variable resistance layer being included in the variable resistance element included in the at least one memory cell selected by the selection circuit. Stated differently, the present invention may be limited to a case where additional writing is performed on the memory cell, as writing into the memory cell in which the substrate bias voltage is applied. With this, in the additional writing for which a voltage larger than the voltage in the normal writing is required, the substrate bias effect reduces the on-resistance of the selection transistor and causes the large voltage corresponding to the reduction to be applied to the variable resistance element, and the additional writing is accomplished more surely (or with a fewer number of times).

Here, the substrate bias circuit may apply the first bias voltage in the case where writing has been performed on the variable resistance element a predetermined number of times, the variable resistance element being included in the at least one memory cell selected by the selection circuit. To put it differently, the present invention may be limited to a refresh process, that is, a case where the writing is performed with a larger voltage for writing when the writing has been performed a certain number of times, as the writing into the memory cell in which the substrate bias voltage is applied. With this, in the refresh process for which a voltage larger than the voltage in the normal writing is required, the substrate bias effect reduces the on-resistance of the selection transistor and causes the large voltage corresponding to the reduction to be applied to the variable resistance element, and thus the refresh process is more surely performed.

Here, the region of the first conductivity type of the semiconductor substrate may be a well of the first conductivity type formed in the semiconductor substrate, and the substrate bias circuit may apply the first bias voltage to the well. In other words, the selection transistor included in the memory cell may be formed within the well formed in the semiconductor substrate. With this, it is possible to apply the substrate bias voltage to the well, and thus it is possible to apply the substrate bias voltage with the substrate itself fixed to another potential (ground, for example).

Here, the nonvolatile storage device may include a source line bias circuit which applies, to a source of a transistor included in a memory cell not selected by the selection circuit, a second bias voltage for suppressing a current flowing through the transistor. With this, in the case where the substrate bias voltage is applied to the selection transistor included in the selected memory cell, the substrate bias effect on the selection transistor included in the non-selected memory cell is suppressed, and thus a leak current flowing through the non-selected memory cell is suppressed.

The following describes in detail preferred embodiments of the present invention with reference to the drawings.

(Embodiment 1)

First, the following describes a nonvolatile storage device according to Embodiment 1 of the present invention.

(Configuration of Variable Resistance Element)

FIG. 1 is a cross-sectional view of a configuration of a variable resistance element included in a nonvolatile storage device in Embodiment 1 of the present invention. As shown in FIG. 1, a variable resistance element 100 includes: a substrate 101; an oxide layer 102 formed on the substrate 101; a lower electrode 103 formed on the oxide layer 102 (an example of a first electrode or a second electrode according to the present invention); a variable resistance layer 104 formed on the lower electrode 103; and an upper electrode 105 formed on the variable resistance layer 104 (an example of the second electrode or the first electrode according to the present invention). The lower electrode 103 and the upper electrode 105 are electrically connected to the variable resistance layer 104. It is to be noted that although the figure shows layers below the lower electrode 103 (the substrate 101 and the oxide layer 102) as components of the variable resistance element, the variable resistance element according to the present invention may include at least the lower electrode 103, the variable resistance layer 104, and the upper electrode 105.

The substrate 101 may be, for instance, a silicon single crystal substrate or a semiconductor substrate. However, the substrate 101 is not limited to these substrates. The variable resistance layer 104 can be formed at a relatively low substrate temperature and thus can be formed on a resin material and the like.

The materials of the lower electrode 103 and the upper electrode 105 are, for example, one or more of Au (gold), Pt (platinum), Ir (iridium), Pd (palladium), Ag (silver), and Cu (copper).

The variable resistance layer 104 is a layer including a metal oxide whose resistance state reversibly changes between a low resistance state and a high resistance state based on a voltage pulse applied between the lower electrode 103 and the upper electrode 105, and has a stacked structure including a first metal oxide layer and a second metal oxide layer whose oxygen content percentage is higher than that of the first metal oxide layer. Specifically, the variable resistance layer 104 is formed by stacking a first tantalum oxide layer 104a, an example of the first metal oxide layer, and a second tantalum oxide layer 104b, an example of the second metal oxide layer. Here, an oxygen content percentage of the second tantalum oxide layer 104b is higher than that of the first tantalum oxide layer 104a.

(Manufacturing Method of Variable Resistance Element)

The variable resistance element 100 configured as described above can be manufactured in the following manner.

Figure 2:
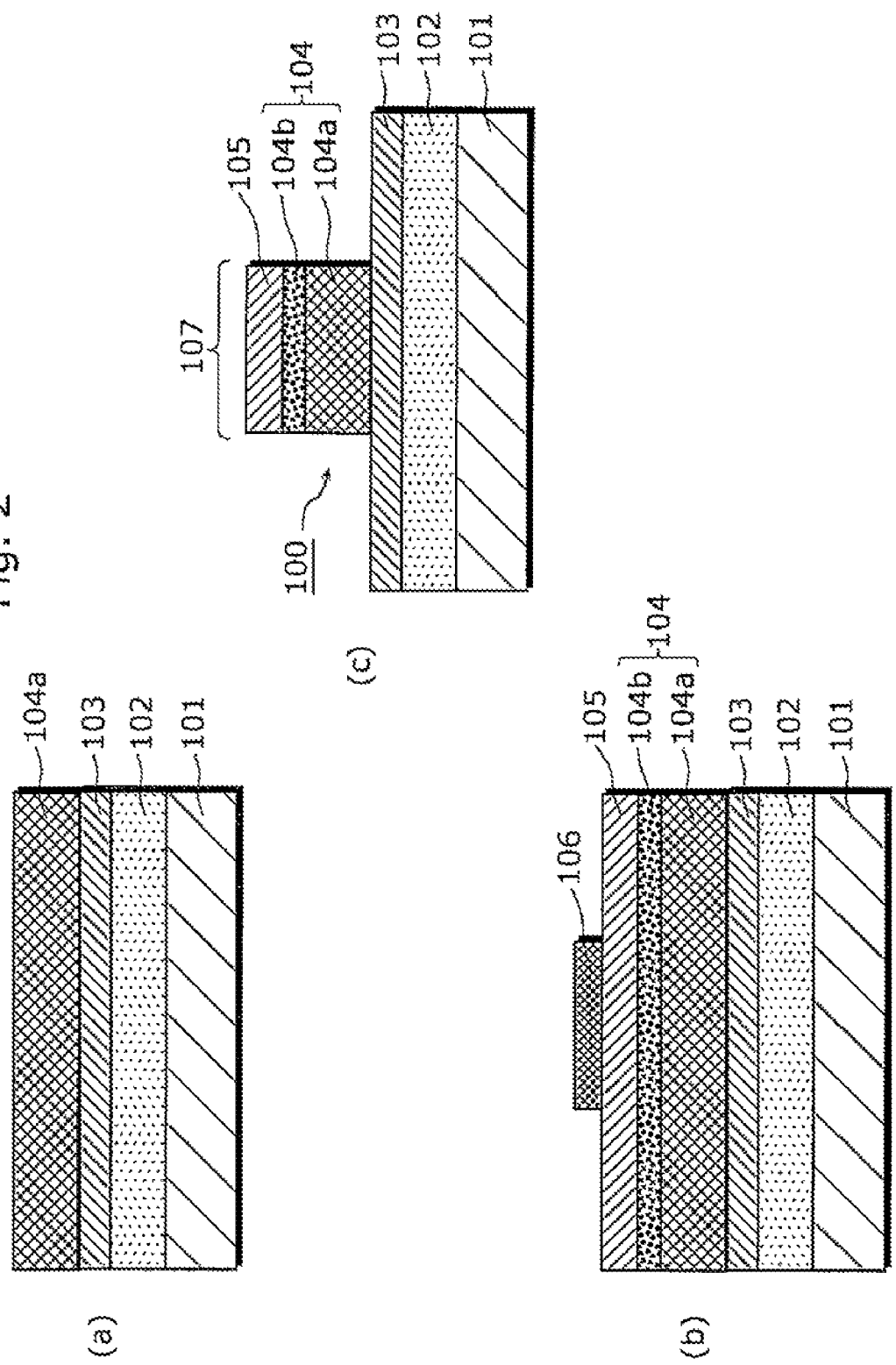
FIG. 2(a) to (c) is a cross-sectional view of a manufacturing process of a variable resistance element included in a nonvolatile storage device in Embodiment 1 of the present invention.

FIG. 2(a) to (c) is a cross-sectional view of an example of a manufacturing process of the variable resistance element 100 included in the nonvolatile storage device according to Embodiment 1 of the present invention.

First, as shown in FIG. 2(a), thermal oxidation produces the oxide layer 102 having a thickness of 200 nm on the substrate 101 made of single-crystal silicon. Then, by sputtering, a Pt thin film having a thickness of 100 nm is formed on the oxide layer 102 as the lower electrode 103. After that, the first tantalum oxide layer 104a is formed on the lower electrode 103 by reactive sputtering, with Ta used as a target.

Here, deposition of the first tantalum oxide layer 104a can be performed under the following condition. In other words, after a substrate is placed in a sputtering apparatus, inside the sputtering apparatus is vacuumed to almost $8 \times 10^{-6}$ Pa. Then, the sputtering is performed for 20 seconds with tantalum used as the target, power set to 1.6 kW, a flow of an argon gas at 34 sccm, a flow of an oxygen gas at 21 sccm, and the pressure in the sputtering apparatus kept at 0.17 Pa. With this, the first tantalum oxide layer 104a can be deposited with a thickness of 30 nm, a resistivity of 6 mΩcm, and an oxygen content percentage of about 61 at % ($TaO_{1.6}$)

Next, as shown in FIG. 2(b), the top surface of the first tantalum oxide layer 104a is oxidized to modify the surface property. The oxidation treatment forms a second tantalum oxide layer 104b having an oxygen content percentage higher than that of the first tantalum oxide layer 104a. Here, the film thickness of the second tantalum oxide layer 104b is 5 nm.

Subsequently, by sputtering, a Pt thin film having a thickness of 150 nm is formed on the second tantalum oxide layer 104b as the upper electrode 105. To prevent oxidization of the second tantalum oxide layer 104b in the air, the upper electrode 105 is preferably formed immediately after the deposition of the second tantalum oxide layer 104b. Lastly, photolithography processing creates a pattern 106 using a photoresist, and dry etching produces an element region 107 (see FIG. 2(c)). The element region 107 here is assumed to be a rectangle with each side being, for example, 0.5 μm in length.

(Configuration of Memory Cell)

Figure 3:
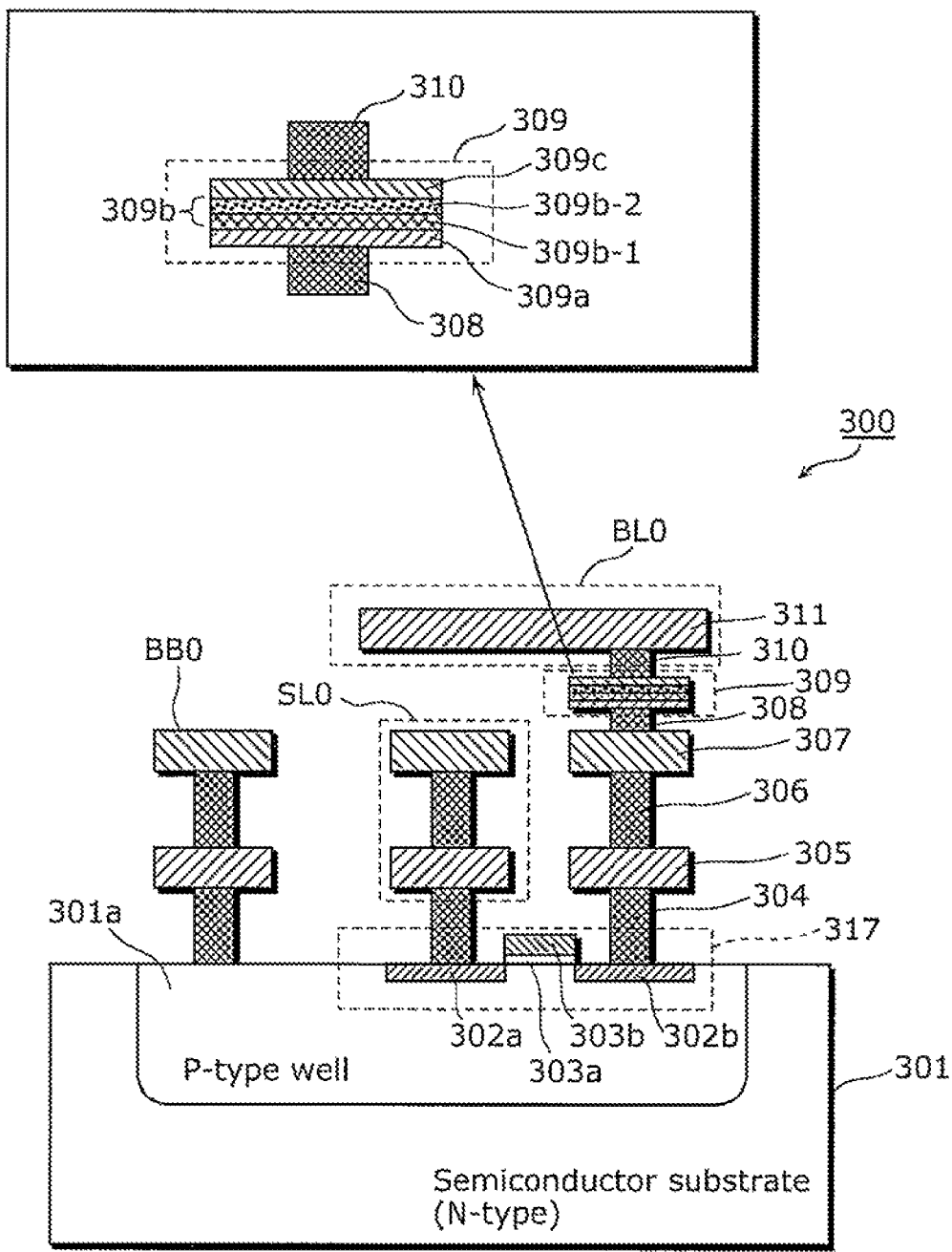
FIG. 3 is a cross-sectional view of a configuration of a nonvolatile storage device according to Embodiment 1 of the present invention.

FIG. 3 is a cross-sectional view of a configuration of one of memory cells 300 each of which includes the variable resistance element manufactured as described above and which constitute a memory cell array included in the nonvolatile storage device according to Embodiment 1 of the present invention. Peripheral components connected to the memory cell 300 are also shown here together. It is to be noted that a memory cell is a storage element including a variable resistance element and a selection transistor that are connected in series in the present embodiment.

A semiconductor substrate 301 is, for instance, an N-type silicon substrate, and includes a region of a first conductivity type (P-type well (P-type diffusion layer) 301a in the present embodiment) for forming a transistor 317.

The transistor 317 (a first N-type diffusion layer region 302a, a second N-type diffusion layer region 302b, a gate insulator film 303a, and a gate electrode 303b), a first via 304, a first wiring layer 305, a second via 306, a second wiring layer 307, a third via 308, a variable resistance element 309, a fourth via 310, and a third wiring layer 311 are formed above the semiconductor substrate 301 in this order. It is to be noted that the first N-type diffusion layer region 302a and the second N-type diffusion layer region 302b included in the transistor 317 are examples of a first diffusion region of second conductivity type and a second diffusion region of the second conductivity type according to the present invention, respectively.

As shown in FIG. 3, the third wiring layer 311 connected to the fourth via 310 serves as a bit line BL0, and the first wiring layer 305 and the second wiring layer 307 which are electrically connected to the first N-type diffusion layer region 302a of the transistor 317 serve as a source line SL0.

The transistor 317 is an NMOS transistor formed in the P-type well 301a formed in the semiconductor substrate 301. A substrate terminal BB0 is connected to the P-type well 301a, and further connected to a substrate bias circuit (not shown). The substrate bias circuit can apply a forward substrate bias voltage (a first bias voltage according to the present invention) to a substrate region of the transistor 317 with respect to diffusion regions (the first N-type diffusion layer region 302a and the second N-type diffusion layer region 302b) of a source and a drain of the transistor 317, by applying a voltage to the P-type well 301a via the substrate terminal BB0. With this, a substrate potential of the transistor 317 is controlled.

It is to be noted that the phrase "apply a forward substrate bias voltage" means applying a voltage in a forward direction to (i) a substrate region (or a well) of a first conductivity type in which a transistor is formed and (ii) a diffusion region of a second conductivity type in which the source and drain of the transistor are formed, and specifically means applying a positive voltage to the substrate region of the first conductivity type with reference to the diffusion region of the second conductivity type in the case where the substrate region of the first conductivity type is a P-type semiconductor and the diffusion region of the second conductivity type is an N-type semiconductor and inversely applying a negative voltage to the substrate region of the first conductivity type with reference to the diffusion region of the second conductivity type in the case where the substrate region of the first conductivity type is the N-type semiconductor and the diffusion region of the second conductivity type is the P-type semiconductor.

As shown by the enlarged view in FIG. 3, the variable resistance element 309 has a stacked structure in which the lower electrode 309a, the variable resistance layer 309b, and the upper electrode 309c are formed above the third via 308. Here, the lower electrode 309a is connected to the third via 308 connected to the second wiring layer 307, and the upper electrode 309c is connected to the fourth via 310 connected to the third wiring layer 311.

As stated with reference to FIG. 1, the variable resistance layer 309b has a stacked structure of tantalum oxide layers in the present embodiment. More specifically, in the present embodiment, the variable resistance layer 309b has the stacked structure in which the following layers are stacked: a conductive, first oxygen-deficient tantalum oxide layer 309b-1 having a composition represented by $TaO_x$ (where x=1.54); and a conductive, second oxygen-deficient tantalum oxide layer 309b-2 having a composition represented by TaO$_y$ (where y=2.47). Here, the film thickness of TaO$_x$ (where x=1.54) is 26.6 nm, and the film thickness of TaO$_y$ (where y=2.47) is 2.47 nm.

The lower electrode 309a and the upper electrode 309c are made of the same material, which is Pt (platinum), in the present embodiment. The lower electrode 309a is connected to the second N-type diffusion layer region 302b of the transistor via the vias and the wiring layers, and the upper electrode 309c is connected to the third wiring layer 311 (bit line BL0) via the via.

In FIG. 3, the memory cell includes the transistor 317 and the variable resistance element 309 that are connected in series, and more specifically includes the vias and wiring layers connecting those.

(Gate Width W of Transistor)

As described above, in the present embodiment, applying the forward bias voltage to the substrate of the transistor reduces the on-resistance of the transistor and increases a voltage to be applied to the variable resistance element, which surely enables a resistance change to occur. With this, it is possible to realize a good storage device without increasing the gate width W of the transistor. Focusing on the gate width W of the transistor, the following describes the characteristics of the nonvolatile storage device according to the present embodiment.

Figure 4:
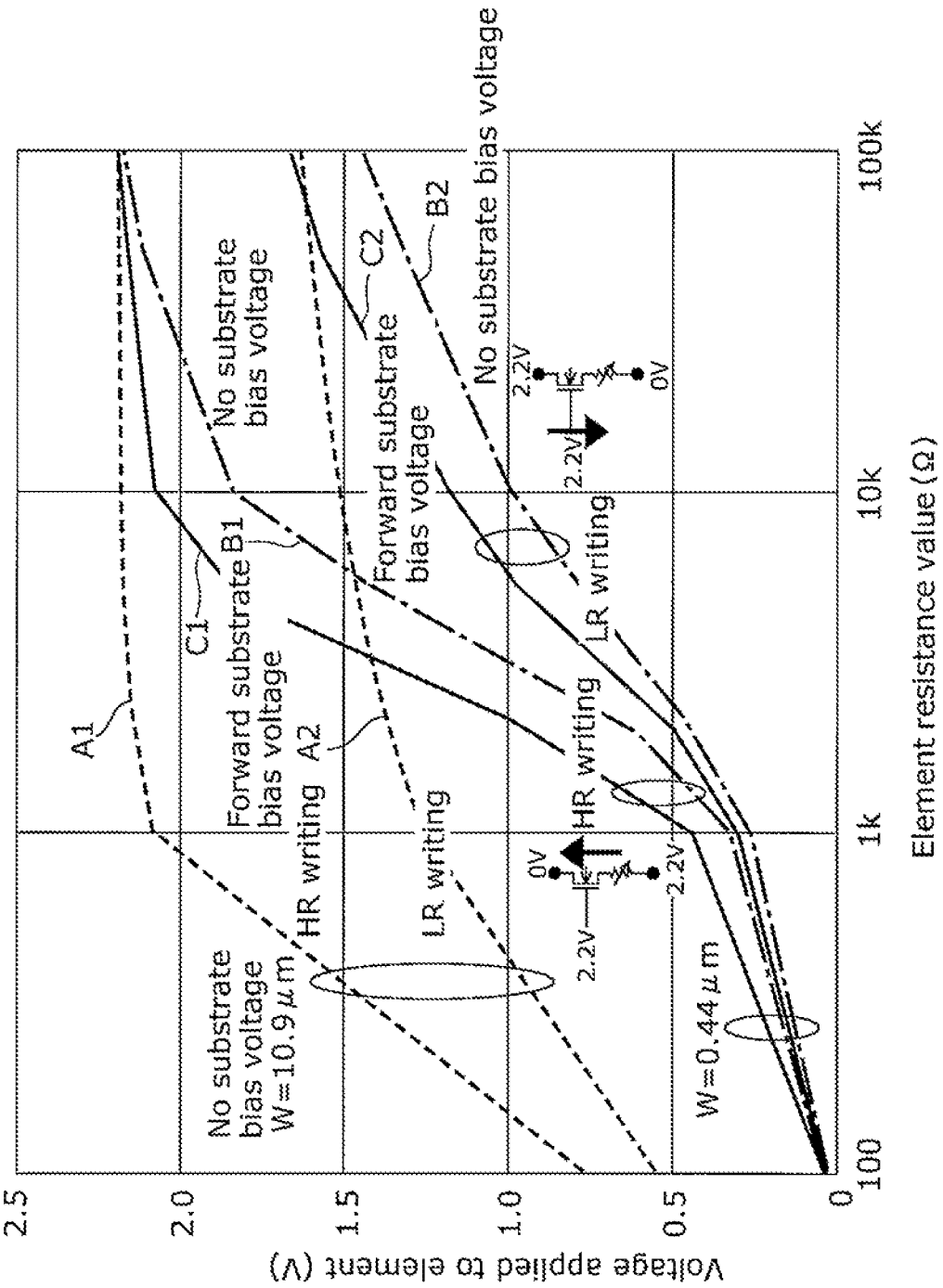
FIG. 4 is a graph showing a relationship between a voltage effectively applied to a variable resistance element (voltage applied to an element) when a predetermined voltage is applied to both ends of a memory cell and a resistance value of the variable resistance element (element resistance value).

FIG. 4 is a graph showing a relationship between (i) a voltage effectively applied to the variable resistance element ("voltage applied to an element (V)" indicated by the vertical axis) and (ii) a resistance value of the variable resistance element ("element resistance value (Ω)" indicated by the horizontal axis) when respective predetermined voltages are applied to one ends of the source line SL0 and the bit line BL0 after the transistor 317 is turned on by applying a voltage sufficiently higher than a threshold voltage of the transistor 317 to the gate electrode 303b of the transistor 317 of the memory cell which includes the transistor 317 and the variable resistance element 309 that are shown in FIG. 3 and connected in series. Here, a result obtained through a simulation performed by a computer is plotted.

In FIG. 4, in the case where a gate length L of the transistor is 0.18 μm and the gate width W of the same is 10.9 μm, a relationship between a voltage applied to an element and an element resistance value when a resistance state of the variable resistance element is changed from a low resistance state to a high resistance state (when a positive voltage is applied) is represented by a graph A1, and similarly a relationship between the voltage applied to the element and the element resistance value when the resistance state of the variable resistance element is changed from the high resistance state to the low resistance state (when a negative voltage is applied) is represented by a graph A2. It is to be noted that, here, the positive voltage is a voltage to be applied to the upper electrode with reference to the lower electrode, and the negative voltage is a voltage to be applied to the lower electrode with reference to the upper electrode.

It is to be noted that the substrate bias voltage as described in the present embodiment is not applied in the graphs A1 and A2.

In the case where the gate length L of the transistor is 0.18 μm and the gate width W of the same is 0.44 μm, a relationship between the voltage applied to the element and the element resistance value when the resistance state of the variable resistance element is changed from the low resistance state to the high resistance state (when the positive voltage is applied) is represented by a graph B1, and similarly a relationship between the voltage applied to the element and the element resistance value when the resistance state of the variable resistance element is changed from the high resistance state to the low resistance state (when the negative voltage is applied) is represented by a graph B2.

It is to be noted that the substrate bias voltage as described in the present embodiment is not applied in the graphs B1 and B2.

Further, in the case where, although the gate width W of the transistor is the same as in the graphs B1 and B2, the same bias voltage as in the above present embodiment is applied, a relationship between the voltage applied to the element and the element resistance value when the resistance state of the variable resistance element is changed from the low resistance state to the high resistance state (when the positive voltage is applied) is represented by a graph C1, and similarly a relationship between the voltage applied to the element and the element resistance value when the resistance state of the variable resistance element is changed from the high resistance state to the low resistance state (when the negative voltage is applied) is represented by a graph C2.

In FIG. 4 which shows the result of the simulation performed under the above conditions, a comparison of the graphs A1 and B1 shows that even when the same voltage is applied to the memory cell, the voltage applied to the element is lower in the case where the gate width W of the transistor is small. This holds true with a comparison of the graphs A2 and B2. This is because a resistance value (on-resistance) in the case where the transistor is in on-state decreases inversely proportional to the gate width W of the transistor and the on-resistance of the transistor increases in the case where W is small, which results in the increase in the voltage applied to the transistor and the decrease in the voltage applied to the variable resistance element.

A comparison of the graphs B1 and C1 shows that even when the same voltage is applied to the memory cell including the transistor having the same gate width W, the voltage applied to the element can be increased by applying the substrate bias voltage described in the present embodiment. This holds true with a comparison of the graphs B2 and C2. This is because application of a forward substrate bias voltage reduces the threshold voltage of the transistor and the on-resistance, which results in the decrease in the voltage applied to the transistor and the increase in the voltage applied to the variable resistance element.

As stated above, the application of the substrate bias voltage described in the present embodiment allows the increase in the voltage applied to the element without increasing the gate width W of the transistor, which enables the resistance value of the variable resistance element to surely change. Therefore, it is possible to achieve the stable operations of the nonvolatile storage device.

It is to be noted that increasing the substrate bias voltage decreases the threshold voltage of the transistor, but an excessive increase in the substrate bias voltage turns on a PN junction diode formed in the P-type well and the N-type diffusion region of the transistor, and a current flows from the P-type well to the variable resistance element. It is necessary to set the threshold voltage to 0.7 V or less, because generally a diffusion potential of the PN diode made of silicon is approximately 0.7 V. More specifically, 0.5 V or less is desirable in order to more surely prevent a phenomenon in which the current flows from the P-type well to the variable resistance element.

Although the above has described the case of the N-channel MOS transistor, a P-channel MOS transistor may be certainly used in the present invention. In such a case, conductivity types of the diffusion regions of the well and the transistor come to have a polarity which is reverse of the polarity of the N-channel MOS, and a polarity of the substrate bias voltage applied to the well becomes a reverse polarity.

(Configuration Example of Nonvolatile Storage Device)

Figure 5:
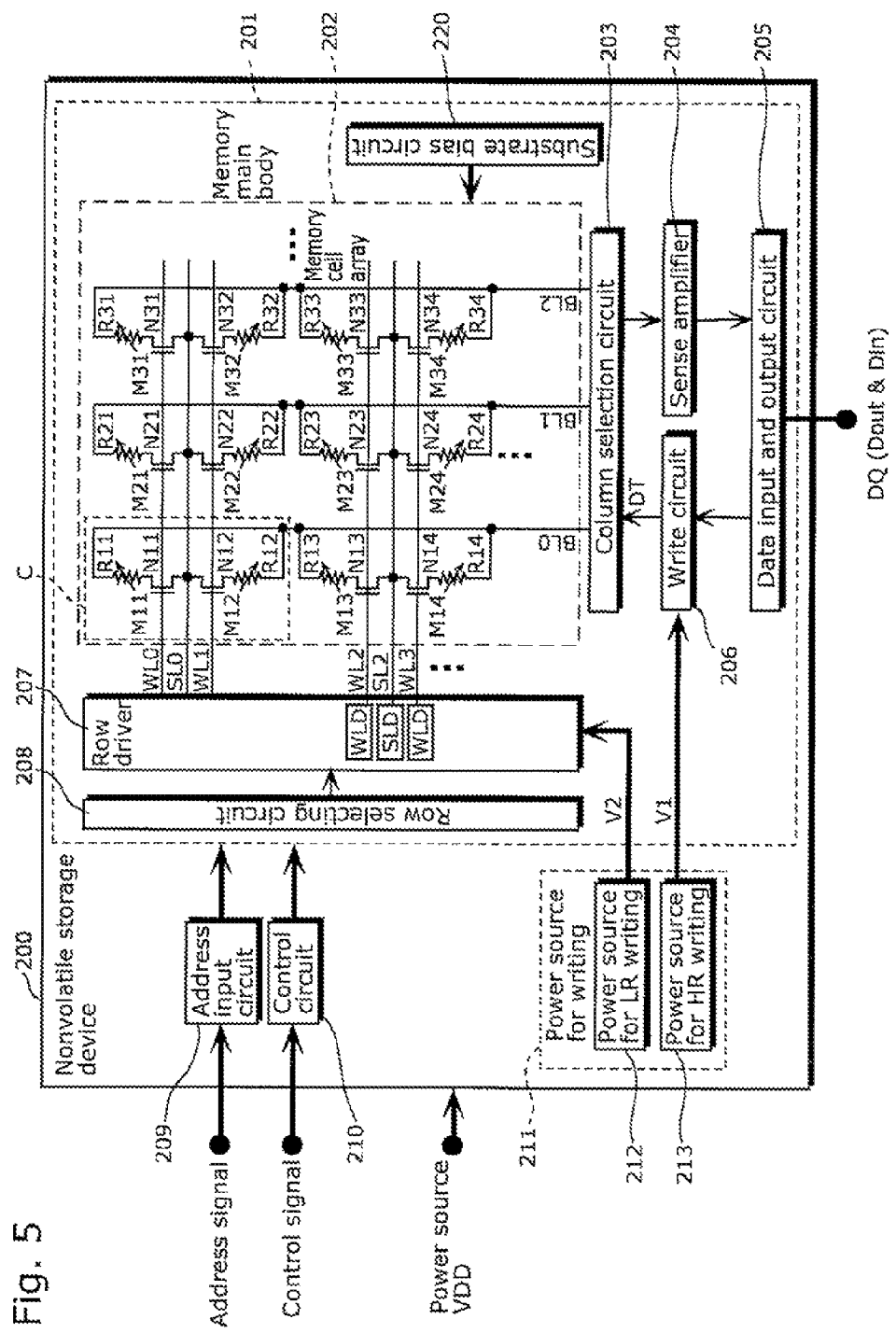
FIG. 5 is a block diagram showing a configuration of a nonvolatile storage device according to Embodiment 1 of the present invention.

The following describes a configuration example of the above-described nonvolatile storage device according to the present embodiment with reference to FIG. 5.

FIG. 5 is a block diagram showing a configuration of the nonvolatile storage device according to Embodiment 1 of the present invention.

As shown in FIG. 5, a nonvolatile storage device 200 according to the present embodiment includes a memory main body 201 on a semiconductor substrate. The memory main body 201 includes: a memory cell array 202 having 1T1R memory cells arranged in a matrix; a row selection circuit 208; a row driver 207 including word line drivers WLD and source line drivers SLD; a column selection circuit 203; a write circuit 206 for writing information; a sense amplifier 204 which detects an amount of current flowing in a selected bit line and determines whether data indicates "1" or "0"; a data input and output circuit 205 which performs an input and output process of input and output data via a terminal DQ; and a substrate bias circuit 220 for applying a forward bias voltage to a substrate of a selection transistor provided to the memory array 202.

The nonvolatile storage device 200 includes, as a power source for writing 211, a power source for low resistance (LR) writing 212 and a power source for high resistance (HR) writing 213. Here, the low resistance (LR) writing means that the resistance state of the variable resistance element is changed from the high resistance state to the low resistance state, and the high resistance (HR) writing means that the resistance state of the variable resistance element is changed from the low resistance state to the high resistance state. An output V2 of the power source for LR writing 212 is provided to the row driver 207, and an output V1 of the power source for HR writing 213 is provided to the write circuit 206.

Further, the nonvolatile storage device 200 includes: an address input circuit 209 which receives an address signal externally inputted; and a control circuit 210 which controls operations of the memory main body 201 based on a control signal externally inputted.

The memory cell array 202 is formed by two-dimensionally arranging the memory cells each of which includes the variable resistance element and the transistor that are connected in series. In the present embodiment, the memory cell array 202 includes: word lines WL0, WL1, WL2 . . . ; bit lines BL0, BL1, BL2 . . . ; source lines SL0, SL2 . . . ; NMOS transistors N11, N12, N13, N21, N22, N23, N31, N32, N33 . . . (hereinafter, referred to as "transistors N11, N12 . . . "); and variable resistance elements R11, R12, R13, R21, R22, R23, R31, R32, R33 . . . (hereinafter, referred to as "variable resistance elements R11, R12 . . . "). Here, the word lines and the bit lines are formed above the semiconductor substrate and arranged to intersect with each other. The source lines each are provided at between two of the adjacent word lines WL0, WL1, WL2 . . . . The transistors N11, N12 . . . are provided at corresponding points where the word lines WL0, WL1, WL2 . . . and the bit lines BL0, BL1, BL2 . . . intersect with each other. The variable resistance elements R11, R12 . . . are connected in series with the transistors N11, N12 . . . on a one-on-one basis. The 1T1R memory cells M11, M12, M13, M21, M22, M23, M31, M32, M33 . . . (hereinafter, referred to as "memory cells M11, M12 . . . ") are arranged in the matrix, and each of the memory cells M11, M12 . . . is formed by a corresponding one of the word lines WL0, WL1, WL2 . . . , a corresponding one of the bit lines BL0, BL1, BL2 . . . , a corresponding one of the source lines SL0, SL2 . . . , a corresponding one of the transistors N11, N12 . . . , and a corresponding one of variable resistance elements R11, R12 . . . .

As shown in FIG. 5, gates of the transistors N11, N21, N31 . . . are connected to the word line WL0, gates of the transistors N12, N22, N32 . . . are connected to the word line WL1, and gates of the transistors N13, N23, N33 . . . are connected to the word line WL2, respectively. Furthermore, the transistors N11, N21, N31 . . . and the transistors N12, N22, N32 . . . are commonly connected to the source line SL0, and the transistors N13, N23, N33 . . . and the transistors N14, N24, N34 . . . are commonly connected to the source line SL2.

Moreover, one of terminals of each of the variable resistance elements R11, R12, R13 . . . is connected to the bit line BL0, the other terminal of each of the variable resistance elements R21, R22, R23 . . . is connected to the bit line BL1. In the same manner, one of terminals of each of the variable resistance elements R31, R32, R33 . . . is connected to the bit line BL2.

It is to be noted that the variable resistance element is represented by a symbol of variable resistance in FIG. 5. An arrow direction shown on the symbol of variable resistance indicates that the resistance state of the variable resistance element is changed from the low resistance state to the high resistance state when the positive voltage is applied in the arrow direction (to the head of the arrow with reference to the back end of the arrow).

The address input circuit 209 receives an address signal from an external circuit (not shown), and simultaneously outputs a row address signal to the row selection circuit 208 and a column address signal to the column selection circuit 203 based on the address signal. Here, the address signal is a signal indicating an address of a specific memory cell to be selected from among the memory cells M11, M12 . . . . Moreover, the row address signal is a signal indicating an address of a row which is a part of the address indicated by the address signal, and the column address signal is similarly a signal indicating an address of a column which is a part of the address indicated by the address signal. It is to be noted that the row selection circuit 208 and the column selection circuit 203 are an example of a selection circuit according to the present invention which selects at least one memory cell by applying a voltage pulse to the gate of the transistor N11 or the like included in the at least one memory cell among the memory cell M11 and the like included in the memory cell array 202.

In a data write cycle, the control circuit 210 outputs, to the write circuit 206, a write command signal instructing application of a voltage for writing, according to input data Din inputted into the data input and output circuit 205. On the other hand, in a data read cycle, the control circuit 210 outputs, to the sense amplifier 204, a read command signal instructing a read operation.

The row selection circuit 208 receives the row address signal outputted from the address input circuit 209, and selects one of the word lines WL0, WL1, WL2 . . . according to the row address signal. The row driver 207 applies a predetermined voltage to the word line selected by the row selection circuit 208, based on an output signal of the row selection circuit 208.

Similarly, the row selection circuit 208 receives the row address signal outputted from the address input circuit 209, and selects one of the source lines SL0, SL2 . . . according to the row address signal. The row driver 207 applies a predetermined voltage to the source line selected by the row selection circuit 208, based on the output signal of the row selection circuit 208.

Furthermore, the column selection circuit 203 receives the column address signal outputted from the address input circuit 209, selects one of the bit lines BL0, BL1, BL2 . . . according to the column address signal, and applies a voltage for writing or a voltage for reading to the selected bit line.

The write circuit 206 is a circuit which applies a voltage pulse for writing to the variable resistance element included in the memory cell selected by the selection circuit according to the present invention via the transistor included in the memory cell. In the present invention, the write circuit 206 outputs, to the column selection circuit 203, a signal instructing the application of the voltage for writing to the selected bit line in the case where the write circuit 206 has received the write command signal outputted from the control circuit 210. It is to be noted that the term "writing" involves the low resistance (LR) writing (writing "0") which changes the resistance state of the variable resistance element from the high resistance state to the low resistance state and the high resistance (HR) writing (writing "1") which inversely changes the resistance state of the variable resistance element from the low resistance state to the high resistance state.

Moreover, in the data read cycle, the sense amplifier 204 detects an amount of a current flowing in the selected bit line to be read, and determines whether data indicates "1" or "0". The resultant output data DO is outputted to the external circuit via the data input output circuit 205.

The substrate bias circuit 220 can apply substrate bias voltages to the transistors N11, N12 . . . provided to the memory cell array 202 by controlling the potential of the P-type well 301a where the memory cell array 202 is formed. The details of the above operation are to be described later.

Figure 6:
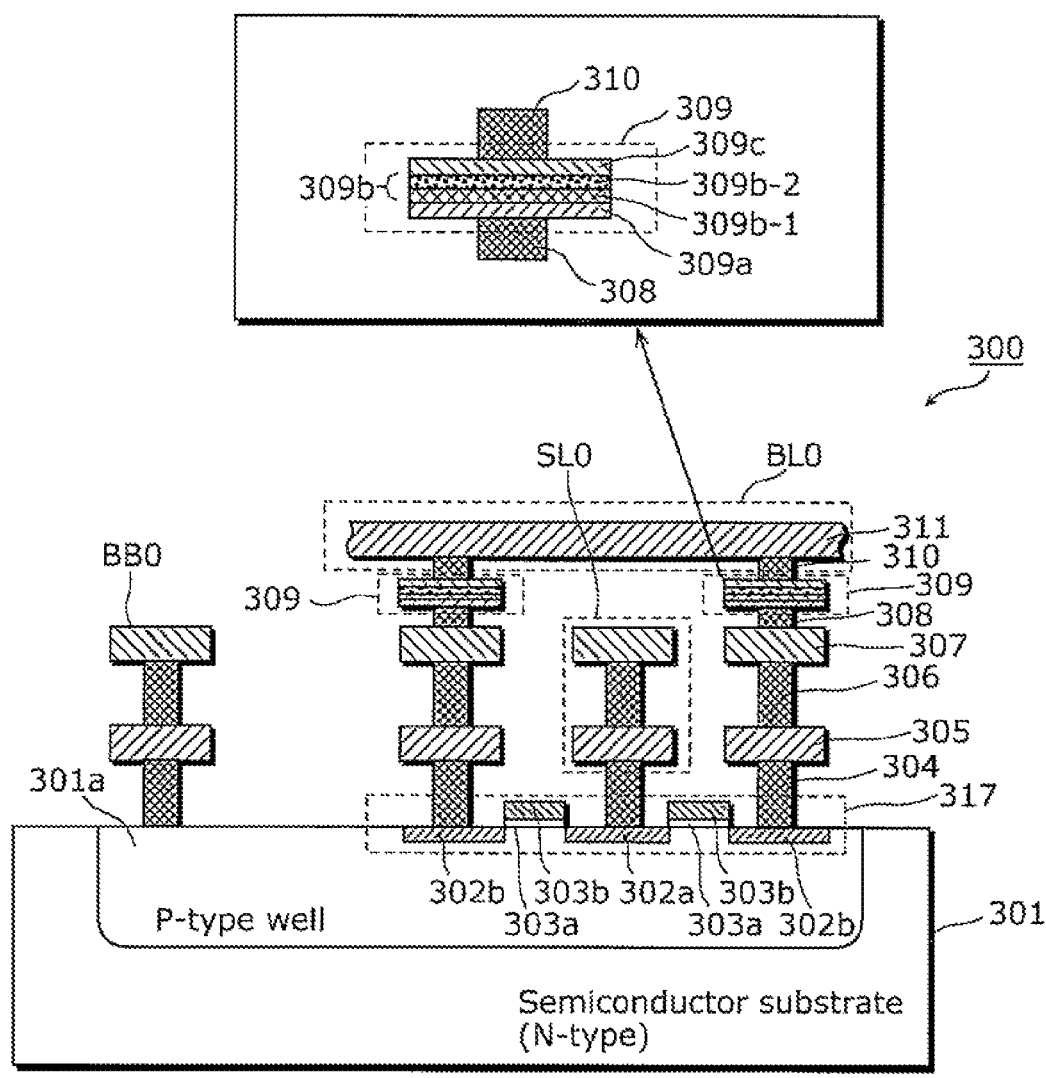
FIG. 6 is a cross-sectional view showing a configuration (2-bit configuration) of a part C shown in FIG. 5.

FIG. 6 is a cross-sectional view showing a configuration (2-bit configuration) of a part C shown in FIG. 5.

The transistor 317 and the variable resistance element 309 in FIG. 6 correspond to the transistors N11, N12 . . . and the variable resistance elements R11, R12 . . . in FIG. 5, respectively.

The transistor 317 (the first N-type diffusion layer region 302a, the second N-type diffusion layer region 302b, the gate insulator film 303a, and the gate electrode 303b), the first via 304, the first wiring layer 305, the second via 306, the second wiring layer 307, the third via 308, the variable resistance element 309, the fourth via 310, and the third wiring layer 311 are formed above the semiconductor substrate (N-type silicon substrate) 301 in this order.

The third wiring layer 311 connected to the fourth via 310 corresponds to the bit line BL0 in FIG. 5, and the first wiring layer 305 and the second wiring layer 307 electrically connected to the first N-type diffusion layer region 302a of the transistor 317 correspond to the source line SL0 in FIG. 5.

The transistor 317 is formed in the P-type well 301a (the region of the first conductivity type according to the present invention, more specifically, a well of the first conductivity type) formed in the semiconductor substrate 301. The substrate terminal BB0 is connected to the P-type well 301a, and further connected to a substrate bias circuit 220. The substrate bias circuit 220 can apply a forward substrate bias voltage to the transistor 317 by applying a voltage to the P-type well 301a via the substrate terminal BB0. With this, the substrate potential of the transistor 317 is controlled.

In the present embodiment, the selection transistors included in the memory cell array are formed in the same P-type well 301a, and the substrate potentials of the selection transistors can be controlled using one of the substrate terminals BB0. With this configuration, it is not necessary to remove a substrate terminal from each of the transistors. Thus, even in the case where the nonvolatile storage device is configured so that the substrate bias voltage is applied, it is possible to minimize an increase in cell area, which allows high integration of the memory cell array.

As shown by the enlarged view in FIG. 6, the variable resistance element 309 has a stacked structure in which the lower electrode 309a, the variable resistance layer 309b, and the upper electrode 309c are formed above the third via 308. Here, the lower electrode 309a is connected to the third via 308 connected to the second wiring layer 307, and the upper electrode 309c is connected to the fourth via 310 connected to the third wiring layer 311.

It is to be noted that as stated with reference to FIG. 1, the variable resistance layer 309b has the stacked structure of the tantalum oxide layers. As described above, in the present embodiment, the variable resistance layer 309b has the stacked structure in which the following layers are stacked: the conductive, first oxygen-deficient tantalum oxide layer 309b-1 having composition represented by $TaO_x$ (where x=1.54); and the conductive, second oxygen-deficient tantalum oxide layer 309b-2 having composition represented by $TaO_y$ (where y=2.47). Here, the film thickness of $TaO_x$ (where x=1.54) is 26.6 nm, and the film thickness of $TaO_y$ (where y=2.47) is 2.47 nm.

The lower electrode 309a and the upper electrode 309c are made of the same material, which is Pt (platinum), in the present embodiment. The lower electrode 309a is connected to the second N-type diffusion layer region 302b of the transistor via the vias, and the upper electrode 309c is connected to the third wiring layer 311 (bit line BL0) via the via.

(Operations of Nonvolatile Storage Device)

The following describes operations of the nonvolatile storage device 200 thus configured, in a write cycle to write data and a read cycle to read data.

Figure 7:
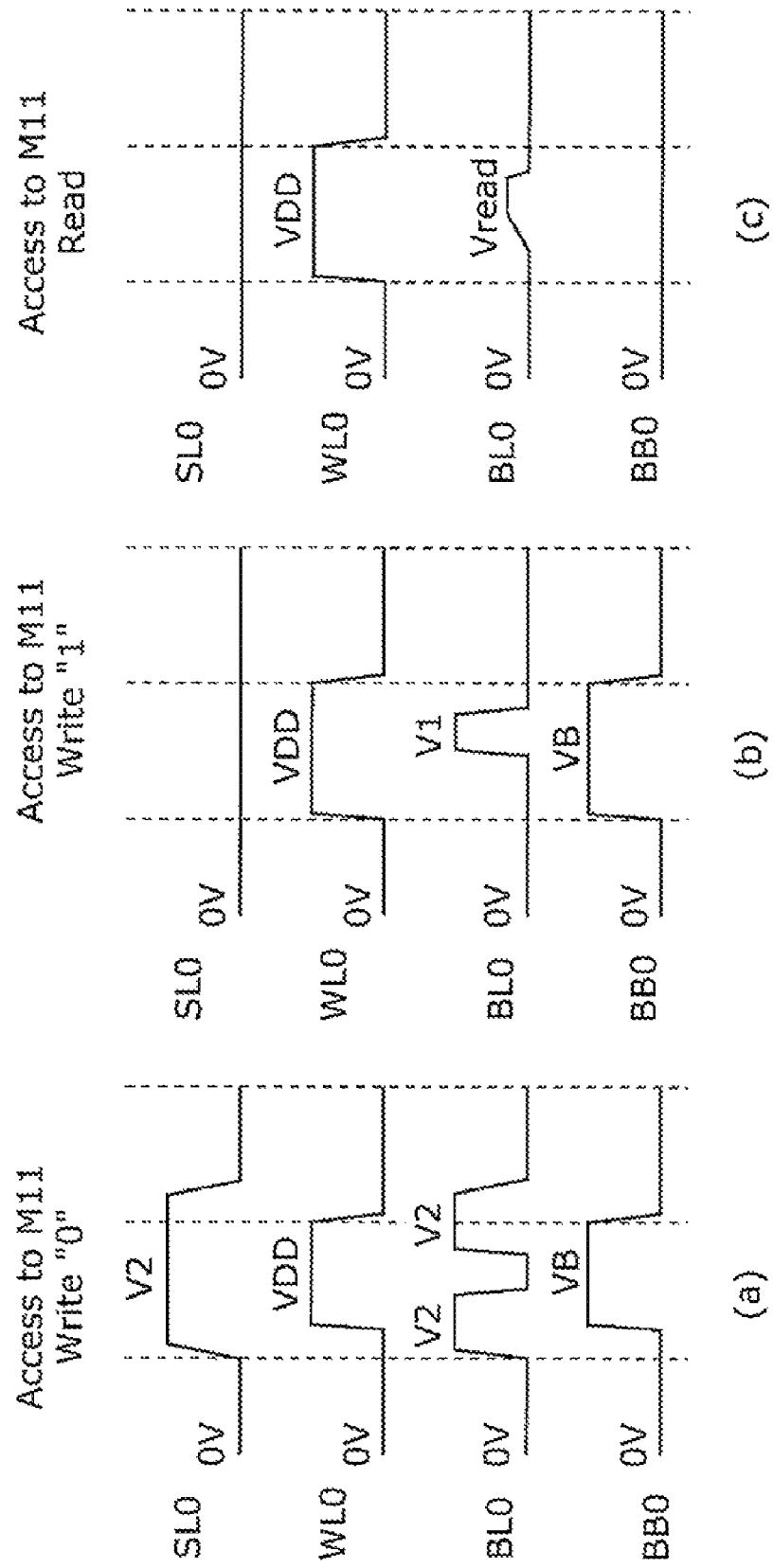
FIG. 7(a) to (c) is a timing diagram showing an operation example of a nonvolatile storage device according to Embodiment 1 of the present invention.

FIG. 7(a) to (c) is a timing diagram showing an operation example of the nonvolatile storage device 200 according to Embodiment 1 of the present invention. It is to be noted that, here, the operation example is described with an assumption that data "1" corresponds to a case where a variable resistance layer is in a high resistance state and data "0" corresponds to a case where a variable resistance layer is in a low resistance state. Furthermore, in the following description, the memory cell M11 in FIG. 5 is selected, and only cases of writing and reading data for the selected memory cell M11 are described.

It is to be noted that, hereinafter, V1 and V2 indicate voltages generated by the power source for HR writing 213 and the power source for LR writing 212, respectively, Vread indicates a voltage for reading generated by the sense amplifier 204, and VDD indicates a power supply voltage supplied to the nonvolatile storage device 200. Further, VB indicates a bias voltage generated by the substrate bias circuit 220.

In a data "0" write cycle for the memory cell M11 shown in FIG. 7(a), first, the column selection circuit 203 and the row selection circuit 208 set the selected bit line BL0 and the source line SL0 to a voltage V2 (e.g., 2.2 V), respectively (the row selection circuit 208 does this via the row driver 207). Next, the row selection circuit 208 sets a word line WL0 to be selected to the voltage VDD (e.g., 2.2 V) to turn on the NMOS transistor N11 of the selected memory cell M11. Simultaneously, the substrate bias circuit 220 sets the substrate terminal BB0 of the NMOS transistor N11 to the bias voltage VB (e.g., 0.3 V). A current does not flow at this stage, because the voltage V2 is applied to both the first N-type diffusion layer region 302a and the second N-type diffusion layer region 302b of the transistor 317 (NMOS transistor N11).

Then, the write circuit 206 sets, via the column selection circuit 203, the selected bit line BL0 to the voltage 0 V only for a predetermined time period, and subsequently outputs a voltage pulse for writing by setting the selected bit line BL0 to the voltage V2 again. At this stage, the voltage for writing is applied between the lower electrode 309a and the upper electrode 309c, and the resistance state of the variable resistance element 309 (R11) is changed from the high resistance state to the low resistance state. Subsequently, the row selection circuit 208 sets, via the row driver 207, the word line WL0 to the voltage 0 V to turn off the transistor 317 (NMOS transistor N11), and the writing of the data "0" is completed.

As stated above, the substrate bias circuit 220 applies the forward bias voltage to the substrate of the NMOS transistor N11, so that the threshold voltage of the NMOS transistor N11 can be reduced. This makes it possible to increase the voltage applied to the variable resistance element R11. As a result, it is possible to surely change the resistance state of the variable resistance element R11 from the high resistance state to the low resistance state.

In a data "1" write cycle for the memory cell M11 shown in FIG. 7(b), first, the column selection circuit 203 and the row selection circuit 208 set the selected bit line BL0 and the source line SL0 to the voltage 0 V, respectively (the row selection circuit 208 does this via the row driver 207). Next, the row selection circuit 208 sets a word line WL0 to be selected to the voltage VDD (e.g., 2.2 V) to turn on the NMOS transistor N11 of the selected memory cell M11. Simultaneously, the substrate bias circuit 220 sets the substrate terminal BB0 of the NMOS transistor N11 to the bias voltage VB (e.g., 0.3 V). Then, the write circuit 206 sets, via the column selection circuit 203, the selected bit line BL0 to the voltage V1 (e.g., 2.2 V) only for a predetermined time period, and sets the selected bit line BL0 to the voltage 0 V again. At this stage, the voltage for writing is applied between the lower electrode 309a and the upper electrode 309c, and the resistance state of the variable resistance element 309 (R11) is changed from the low resistance state to the high resistance state. Subsequently, the row selection circuit 208 sets, via the row driver 207, the word line WL0 to the voltage 0 V to turn off the transistor 317 (NMOS transistor N11), and the writing of the data "1" is completed.

As with the case of the data "0" write cycle, in this case also, the substrate bias circuit 220 applies the forward bias voltage to the substrate of the NMOS transistor N11, so that the threshold voltage of the NMOS transistor N11 can be reduced. This makes it possible to increase the voltage applied to the variable resistance element R11. Consequently, it is possible to surely change the resistance state of the variable resistance element R11 from the low resistance state to the high resistance state.

In a data read cycle for the memory cell M11 shown in FIG. 7(c), first, the column selection circuit 203 and the row selection circuit 208 set the selected bit line BL0 and the source line SL0 to the voltage 0 V, respectively (the row selection circuit 208 does this via the row driver 207). Next, the row selection circuit 208 sets, via the row driver 207, a word line WL0 to be selected to the voltage VDD to turn on the NMOS transistor N11 of the selected memory cell M11. Then, the sense amplifier 204 determines whether the data indicates "0" or "1" by setting, via the column selection circuit 203, the selected bit line BL0 to the voltage for reading Vread only for a predetermined time period and detecting a value of a current flowing in the selected memory cell M11. Subsequently, the row selection circuit 208 sets, via the row driver 207, the word line WL0 to the voltage 0 V to turn off the transistor 317 (NMOS transistor N11), and the reading of the data is completed.

Figure 8:
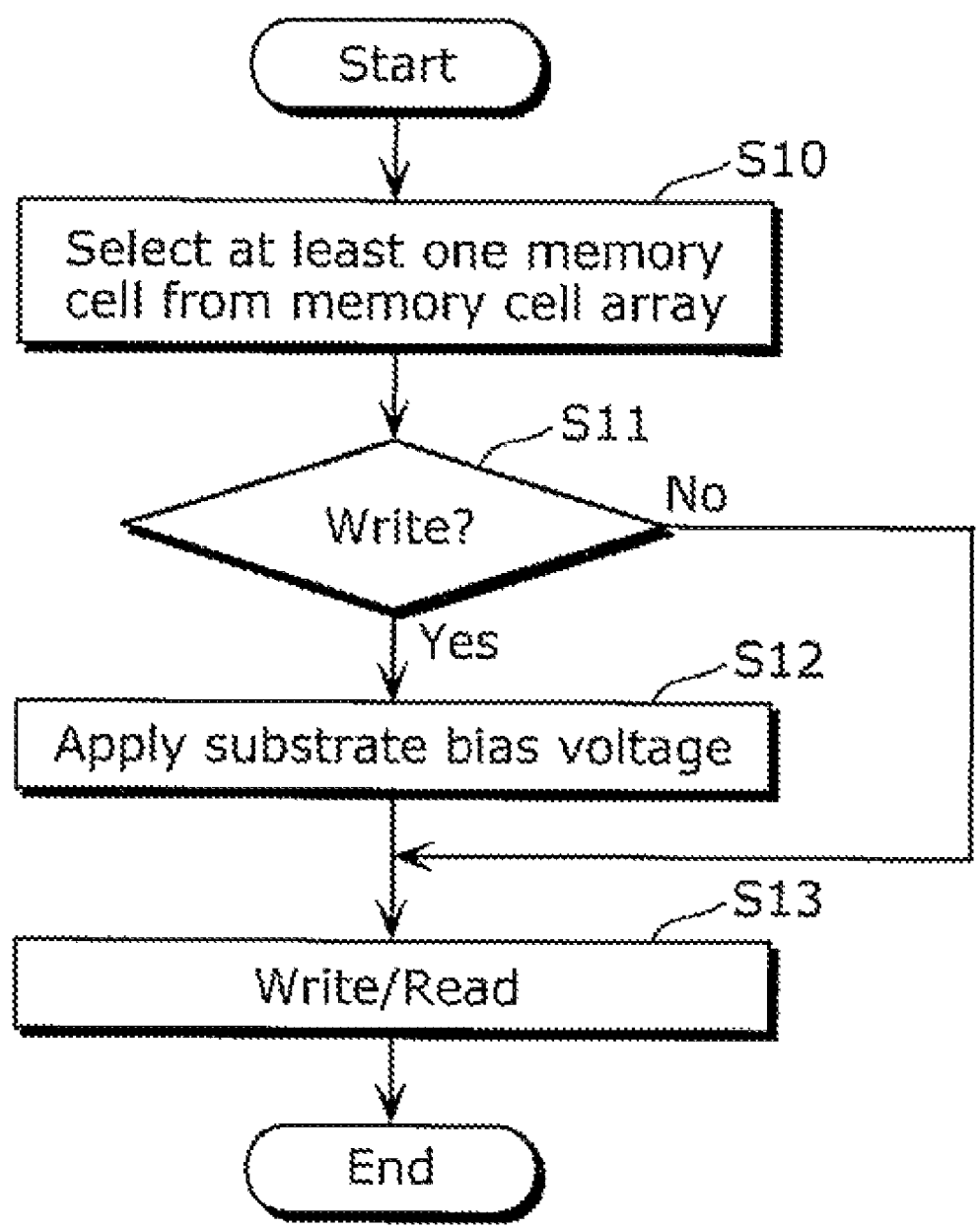
FIG. 8 is a flowchart showing an operation example of a nonvolatile storage device according to Embodiment 1 of the present invention.

FIG. 8 is a flowchart showing a procedure of application of a substrate bias voltage which is a characteristic operation of the nonvolatile storage device 200 according to the present embodiment. Described here is a procedure of a method for writing performed by the nonvolatile storage device according to the present invention.

First, under an instruction of the control circuit 210, a selection circuit (the row selection circuit 208 and the column selection circuit 203) selects at least one memory cell from the memory cell array 202 (S10). Then, the control circuit 210 determines whether the write cycle or the read cycle is performed on the selected memory cell (S11). In the case where the write cycle is performed (Yes in S11), the control circuit 210 first instructs the substrate bias circuit 220 to apply a substrate bias voltage (S12), and then causes the write circuit 206 to perform the write cycle (application of a voltage pulse for writing) (S13). On the other hand, in the case where the read cycle is performed (No in S11), the control circuit 210 causes the sense amplifier 204 to perform the read cycle without causing the substrate bias circuit 220 to operate (S13).

With this, when the voltage pulse for writing is applied to the variable resistance element included in the memory cell selected in the selection step (S10), a forward bias voltage (e.g., 0.3 V) is applied to a semiconductor substrate (the P-type well 301a in the present embodiment) in which a transistor included in the memory cell is formed, which reduces on-resistance of the transistor. As a result, a higher voltage is applied to the variable resistance element.

As seen above, in the present embodiment, the application of the forward bias voltage to the semiconductor substrate (well) in which the transistor included in the memory cell is formed allows the application of the higher voltage to the variable resistance element. As a result, more stable writing is performed, and it is possible to cause the nonvolatile storage device to stably operate without increasing the gate width of the transistor.

(Embodiment 2)

Next, the following describes a nonvolatile storage device according to Embodiment 2 of the present invention.

As described above, in the case of Embodiment 1, the substrate bias circuit applies the forward bias voltage to the substrate of the transistor with respect to the diffusion region of the source or the drain, so that the voltage applied to the variable resistance element is increased, thereby surely changing the resistance state of the variable resistance element. However, such application of the substrate bias voltage causes application of the bias voltage to transistors of memory cells connected to the same bit line as the selected memory cell, and thus threshold voltages of the transistors may be reduced and a leak current may occur. As a result, a problem may arise that risk of erroneous writing increases. The nonvolatile storage device according to Embodiment 2 can address the above problem.

It is to be noted that a basic configuration of the nonvolatile storage device according to Embodiment 2 is the same as in the case of Embodiment 1 shown in FIG. 5, and thus the basic configuration is not described. The nonvolatile storage device according to Embodiment 2 performs a unique operation on non-selected memory cells in the write cycle, in addition to the operations of the nonvolatile storage device according to Embodiment 1. The following describes the above with reference to FIG. 5 as required.

The following describes operations of the nonvolatile storage device according to Embodiment 2. It is to be noted that the read cycle in which the data is read is not described, because the read cycle is the same as in the case of Embodiment 1, and the following describes operations in the write cycle in which the data is written.

Figure 9:
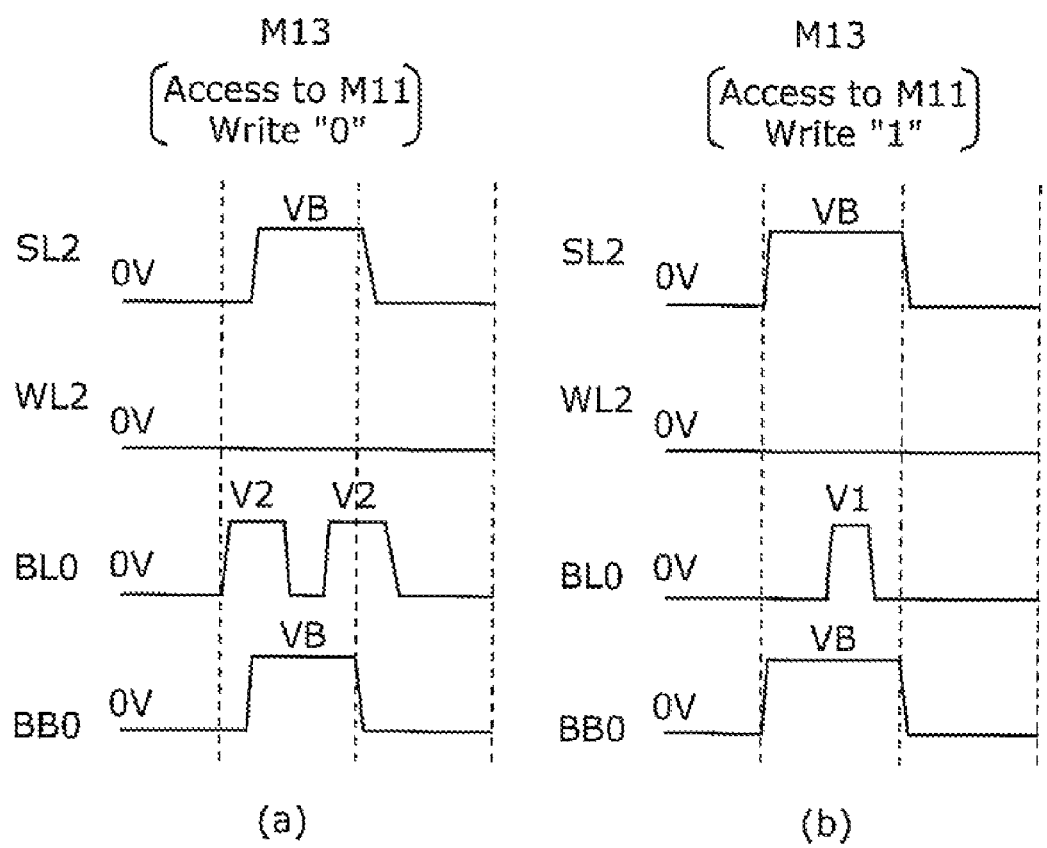
FIGS. 9(a) and (b) is a timing diagram showing an operation example of a nonvolatile storage device according to Embodiment 2 of the present invention.

FIGS. 9(a) and (b) is a timing diagram showing an operation example of the nonvolatile storage device according to Embodiment 2 of the present invention. Here, described is an operation example of a non-selected memory cell M13 connected to the same bit line BL0 as the memory cell M11 in the case of writing the data "0" or "1" into the memory cell M11 shown in FIG. 5. It is to be noted that the operations of the selected memory cell M11 are the same as in the case of Embodiment 1.

As shown in FIG. 9(a), in a data "0" write cycle for the selected memory cell M11, in the non-selected memory cell M13, first, the column selection circuit 203 sets the selected bit line BL0 to the voltage V2 (e.g., 2.2 V). It is to be noted that the voltage VDD (e.g., 2.2 V) is not applied to a word line WL2 because the memory cell M13 is not selected, and thus an NMOS transistor N13 of the memory cell M13 remains in off-state. On the other hand, the substrate bias circuit 220 sets the substrate terminal BB0 of the NMOS transistor N13 to the bias voltage VB (e.g., 0.3 V). At this time, the row selection circuit 208 sets, via the row driver 207 (source line driver SLD (source line bias circuit)), the bias voltage VB to the source line SL2. With this, occurrence of a leak current can be prevented, because a potential difference between a substrate terminal of the NMOS transistor N13 and the source line SL2 disappears. Consequently, it is possible to avoid the erroneous writing.

It is to be noted that in the data "0" write cycle, although the source line SL2 is a signal line connected to the drain of the NMOS transistor N13, in comparison to a case where 0 V is applied to the source line SL2, application of a positive voltage (here bias voltage VB) to the source line SL2 increases the source potential of the NMOS transistor N13, reduces the potential difference between the substrate (P-type well 301a) of the NMOS transistor N13 and the source of the same, and suppresses the leak current of the NMOS transistor N13. To put it differently, the bias voltage VB applied to the source line SL2 corresponds to a second bias voltage according to the present invention which is applied to the source of a transistor included in a non-selected memory cell so that a current flowing in the transistor is suppressed.

As shown in FIG. 9(b), in a data "1" write cycle for the selected memory cell M11, in the non-selected memory cell M13, first, the column selection circuit 203 sets the selected bit line BL0 to the voltage 0 V. In this case also, the memory cell M13 is not selected, and thus the NMOS transistor N13 remains in off-state. On the other hand, the substrate bias circuit 220 sets the substrate terminal BB0 of the NMOS transistor N11 to the bias voltage VB (e.g., 0.3 V). At this time, the row selection circuit 208 sets, via the row driver 207 (source line driver SLD (source line bias circuit)), the bias voltage VB to the source line SL2. With this, the occurrence of the leak current can be prevented, because the potential difference between the substrate terminal of the NMOS transistor N13 and the source line SL2 (that is, the source of the NMOS transistor N13) disappears. Consequently, it is possible to avoid the erroneous writing.

The bias voltage VB applied to the source line SL2 corresponds to the second bias voltage according to the present invention which is applied to the source of the transistor included in the non-selected memory cell so that the current flowing in the transistor is suppressed.

As stated above, in the memory cell connected to the same bit line as the selected memory cell, the occurrence of the leak current can be prevented by applying the bias voltage to the source line. With this, even in the case where bias voltages are applied to substrates of transistors in a memory cell array, it is possible to prevent the erroneous writing from occurring to any non-selected memory cell.

(Embodiment 3)

Next, the following describes a nonvolatile storage device according to Embodiment 3 of the present invention.

In a nonvolatile storage device including variable resistance elements, in the case where a resistance value of a variable resistance element is an initial resistance value (resistance value at a time when a voltage is applied for the first time after the variable resistance element is manufactured, that is, resistance value at a time when a voltage pulse has not yet been applied since the manufacture of the variable resistance element), there are times when a process for applying a voltage higher than a voltage applied during normal writing (hereinafter, referred to as "initialization process") is performed so that the resistance value of the variable resistance element can change repeatedly in a stable manner. The nonvolatile storage device according to Embodiment 3 achieves the initialization process by causing the substrate bias circuit 220 to apply a forward bias voltage (first bias voltage according to the present invention) to a substrate of a transistor.

It is to be noted that a basic configuration of the nonvolatile storage device according to Embodiment 3 is the same as in the case of Embodiment 1 shown in FIG. 5, and thus the basic configuration is not described. Unlike the nonvolatile storage device according to Embodiment 1 which applies the substrate bias voltage in the write cycle, the nonvolatile storage device according to Embodiment 3 applies the substrate bias voltage only in the initialization process. The following describes the above with reference to FIG. 5 as required.

As stated above, the nonvolatile storage device according to Embodiment 3 causes the substrate bias circuit 220 to apply the substrate bias voltage in the initialization process. To put it differently, the write process in Embodiment 1 described with reference to FIG. 5 is performed in the initialization process.

Figure 10:
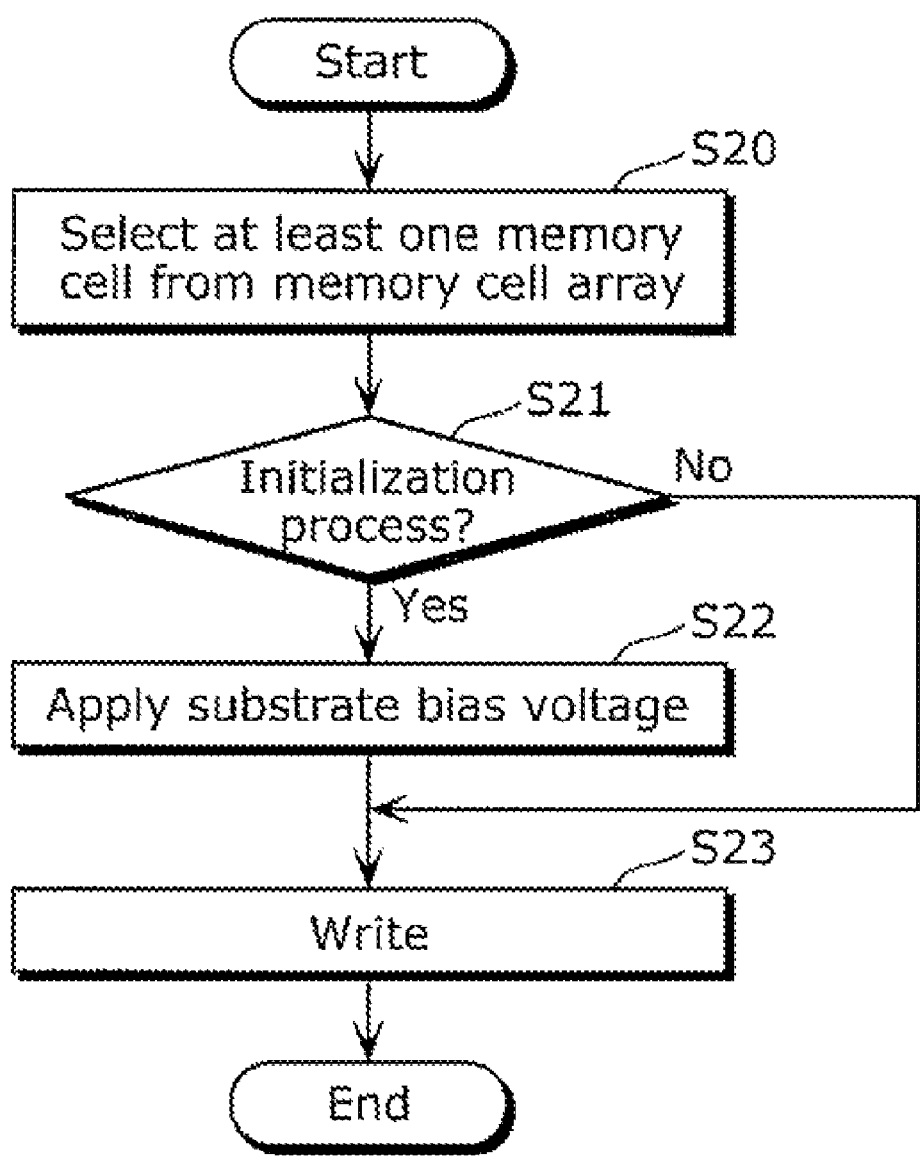
FIG. 10 is a flowchart showing an operation example of a nonvolatile storage device according to Embodiment 3 of the present invention.

FIG. 10 is a flowchart showing a procedure of application of a substrate bias voltage which is a characteristic operation of the nonvolatile storage device according to the present embodiment. Described here is the procedure in the write cycle performed by the nonvolatile storage device according to the present invention.

First, under an instruction of the control circuit 210, a selection circuit (the row selection circuit 208 and the column selection circuit 203) selects at least one memory cell into which data is to be written from the memory cell array 202 (S20). Then, the control circuit 210 determines whether or not first writing (that is, the initialization process) is performed after the manufacture (S21). In the case where it is determined that the initialization process is performed (Yes in S21), the control circuit 210 first instructs the substrate bias circuit 220 to apply a substrate bias voltage (S22), and then causes the write circuit 206 to perform the write cycle (application of a voltage pulse for writing) (S23). On the other hand, in the case where it is determined that the initialization process is not performed (second or subsequent writing is performed) (No in S21), the control circuit 210 simply causes the write circuit 206 to perform the read cycle (the application of the voltage pulse for writing) without causing the substrate bias circuit 220 to operate (S23). With this, it is possible to increase a voltage applied to an element in the initialization process more than a voltage applied to an element during normal writing, and thus stabilization of subsequent resistance change can be achieved.

Figure 11:
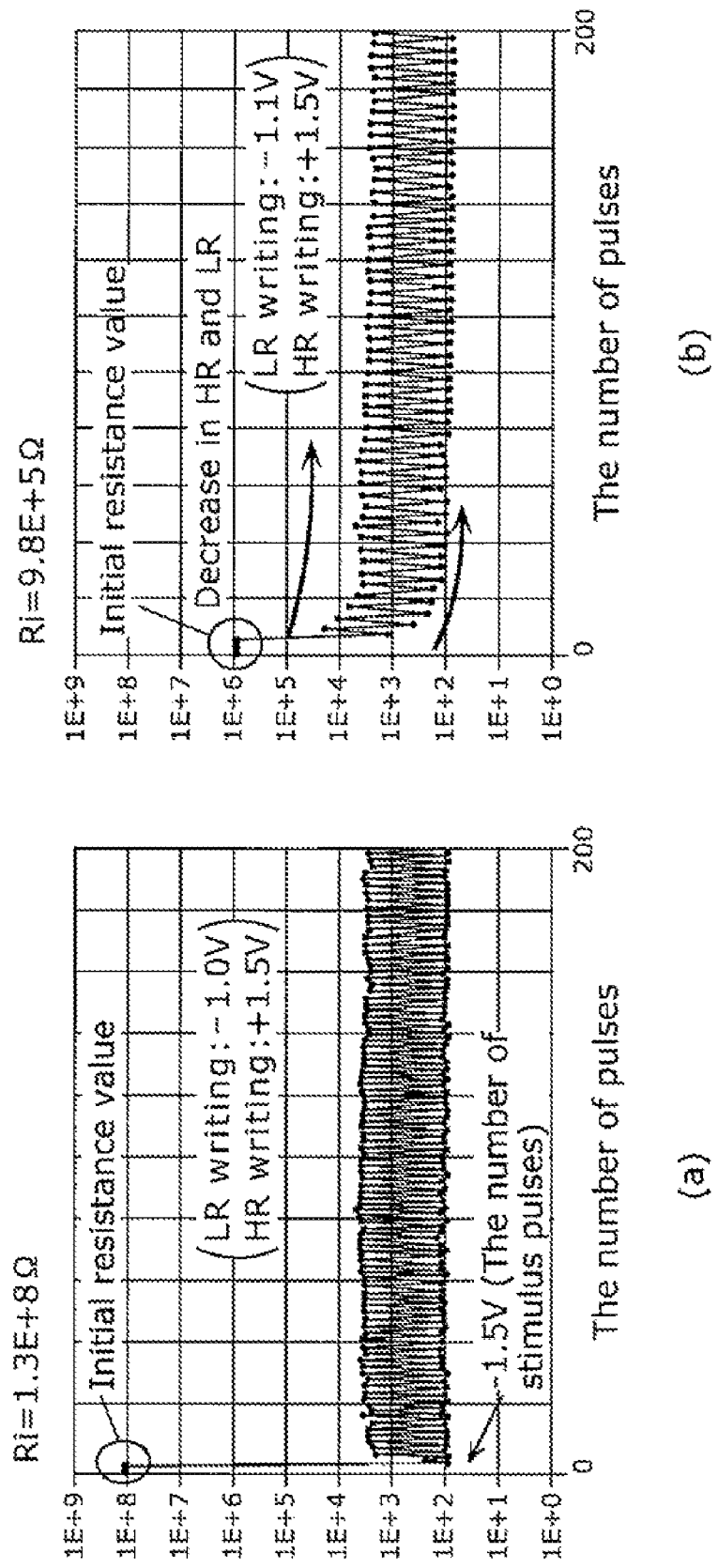
FIGS. 11(a) and (b) is a graph showing a change of a resistance state of a variable resistance element included in a nonvolatile storage device in Embodiment 3 of the present invention.

FIGS. 11(a) and (b) is a graph showing a change of a resistance state of a variable resistance element included in a nonvolatile storage device. More specifically, FIG. 11(a) shows a change of a resistance state of the nonvolatile storage device according to Embodiment 3 of the present invention, whereas FIG. 11(b) shows a resistance change of a variable resistance element in the case where the initialization process is not performed.

In FIG. 11(a), LR writing is performed by applying, as a stimulus pulse, a voltage of −1.5 V to the variable resistance element only in the initialization process, and +1.5 V as a voltage for HR writing and −1.0 V as a voltage for LR writing are alternately and repeatedly applied in subsequent write processes. As with the timing shown in FIG. 7(a), the stimulus pulse is applied with the substrate bias circuit 220 applying the forward substrate bias voltage.

On the other hand, in FIG. 11(b), the initialization process is not performed, and +1.5 V as the voltage for HR writing and −1.1 V as the voltage for LR writing are alternately and repeatedly applied to the variable resistance element.

In the case where, in the initialization process, the stimulus pulse is applied to the variable resistance element with the substrate bias circuit 220 applying the forward substrate bias voltage, as shown in FIG. 11(a), a resistance value of the variable resistance element is stable in either a high resistance state or a low resistance state from when the initialization process is performed. In contrast, in the case where the initialization process in which such a stimulus pulse is applied is not performed, as shown in FIG. 11(b), it is necessary to repeatedly apply a voltage pulse 20 to 30 times until the resistance value is stabilized in either the high resistance state or the low resistance state.

As stated above, the application of the forward substrate bias voltage using the substrate bias circuit 220 in the initialization process makes it possible to immediately stabilize the resistance change of the variable resistance element. With this, it is possible to realize the nonvolatile storage device which can operate stably.

It is to be noted that although the nonvolatile storage device according to the present embodiment applies the substrate bias voltage only in the initialization process, as with Embodiment 1, the substrate bias voltage may be applied also in the normal write cycle, in addition to the initialization process. At that time, it is preferable to perform treatment in Embodiment 2 (that is, the application of the bias voltage to the source of the transistor included in the non-selected memory cell) on the non-selected memory cell.

(Embodiment 4)

Next, the following describes a nonvolatile storage device according to Embodiment 4 of the present invention.

The nonvolatile storage device according to Embodiment 4 causes the substrate bias circuit 220 to apply a forward substrate bias voltage when a resistance state of a resistance variable element is changed from a low resistance state to a high resistance state.

It is to be noted that a basic configuration of the nonvolatile storage device according to Embodiment 4 is the same as in the case of Embodiment 1 shown in FIG. 5, and thus the basic configuration is not described. Unlike the nonvolatile storage device according to Embodiment 1 which applies the forward bias voltage in both the LR writing (writing "0") and the HR writing (writing "1") in the write cycle, the nonvolatile storage device according to Embodiment 4 applies a forward bias voltage only in the HR writing. The following describes the above with reference to FIG. 5 as required.

Figure 12:
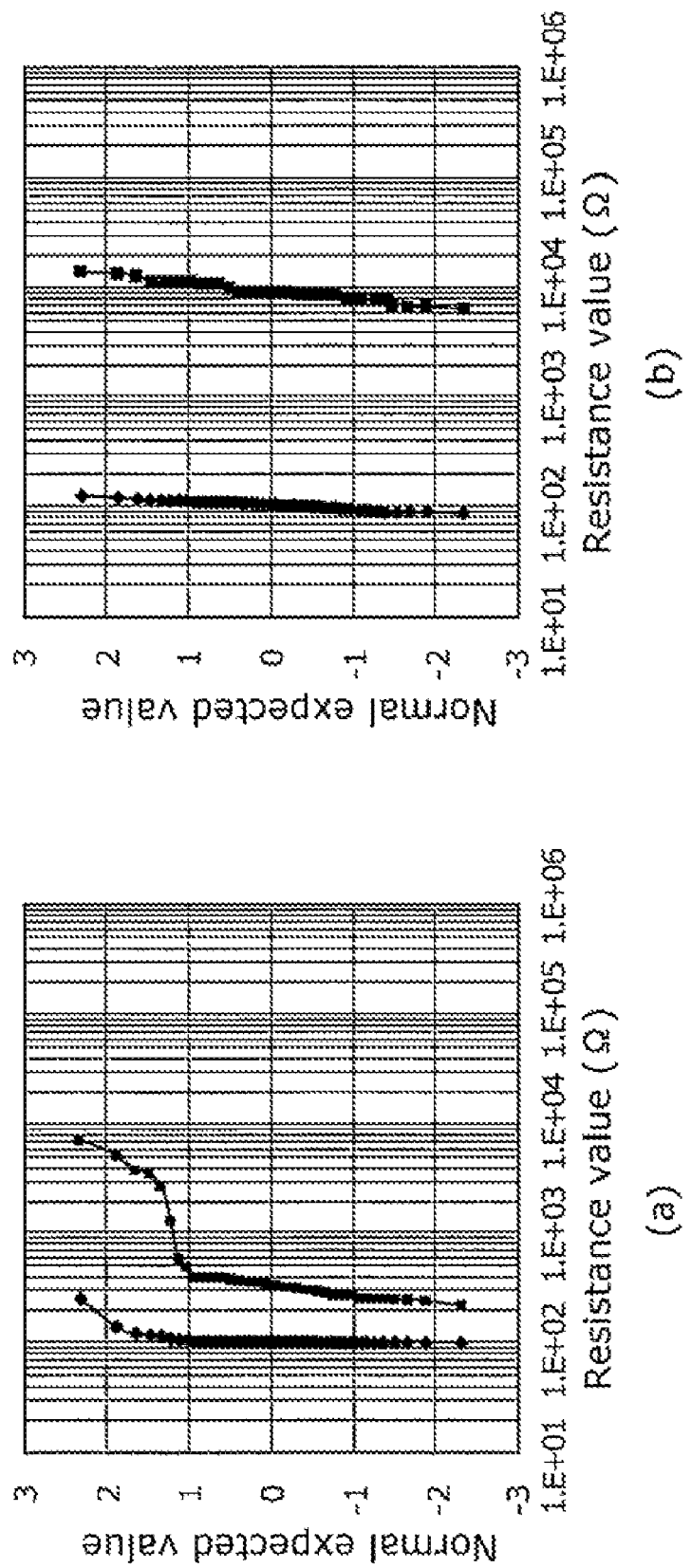
FIGS. 12(a) and (b) is a graph showing a distribution of resistance values in the case where a variable resistance element is rewritten one hundred times in Embodiment 4 of the present invention.

FIGS. 12(a) and (b) is a graph showing a distribution of resistance values in the case where a variable resistance element is rewritten 100 times. FIG. 12(a) shows the distribution of the resistance values in the case where +1.4 V and −1.3 V are applied as a voltage for HR writing and a voltage for LR writing, respectively, and FIG. 12(b) shows the distribution of the resistance values in the case where +1.8 V and −1.3 V are applied as the voltage for HR writing and the voltage for LR writing, respectively. In other words, in FIGS. 12(a) and (b), the voltage for LR writing is the same but only the voltage for HR writing is different, and the voltage for HR writing in FIG. 12(b) is higher than the voltage for HR writing in FIG. 12(a).

As shown in FIGS. 12(a) and (b), any resistance value in the low resistance state is relatively stable. However, resistance values in the high resistance state differ between FIGS. 12(a) and (b). While the resistance values vary and are unstable in FIG. 12(a), the resistance values shown in FIG. 12(b) are stable in the same manner as in the case of the low resistance state. From this, it is clear that a case where a value of "voltage for HR writing/voltage for LR writing (voltage ratio)" is higher makes it possible to stabilize the resistance value in the high resistance state.

The nonvolatile storage device according to the present embodiment, when applying the voltage for HR writing, causes the substrate bias circuit 220 to apply the forward substrate bias voltage to increase the value of "voltage for HR writing/voltage for LR writing", and thus stabilizes the resistance value in the high resistance state.

Figure 13:
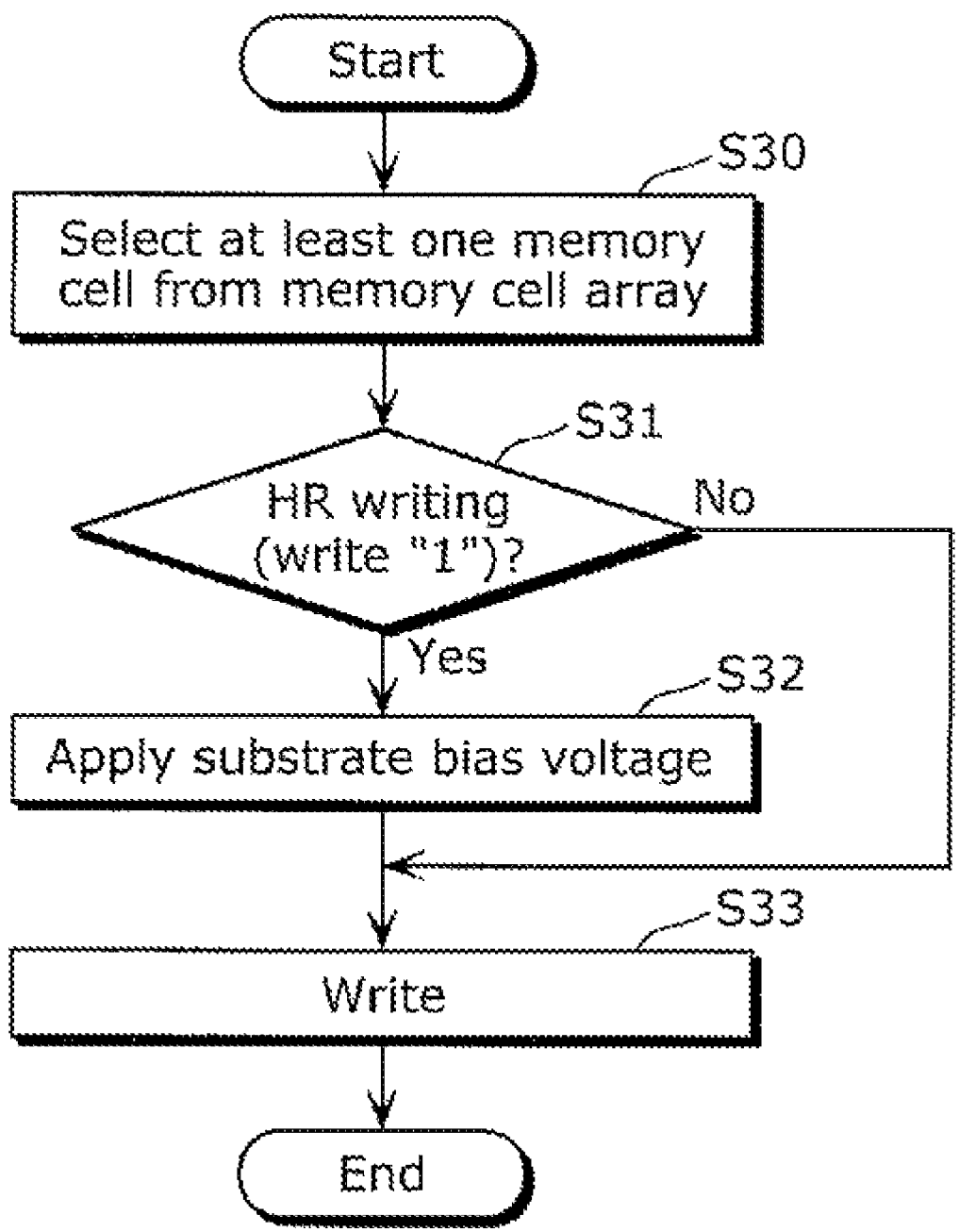
FIG. 13 is a flowchart showing an operation example of a nonvolatile storage device according to Embodiment 4 of the present invention.

FIG. 13 is a flowchart showing a procedure of application of a substrate bias voltage which is a characteristic operation of the nonvolatile storage device according to the present embodiment. Described here is the procedure in the write cycle performed by the nonvolatile storage device according to the present invention.

First, under an instruction of the control circuit 210, a selection circuit (the row selection circuit 208 and the column selection circuit 203) selects at least one memory cell into which data is to be written from the memory cell array 202 (S30). Then, the control circuit 210 determines whether or not the writing to be performed is the HR writing (writing "1") (S31). In the case where it is determined that the writing to be performed is the HR writing (Yes in S31), the control unit 210 first instructs the substrate bias circuit 220 to apply a substrate bias voltage (S32), and then causes the write circuit 206 to perform the HR writing in the write cycle (application of a voltage pulse for writing) (S33). On the other hand, in the case where it is determined that the writing to be performed is not the HR writing (No in S31), the control circuit 210 simply causes the write circuit 206 to perform the LR writing in the write cycle (the application of the voltage pulse for writing) without causing the substrate bias circuit 220 to operate (S33).

Figure 14:
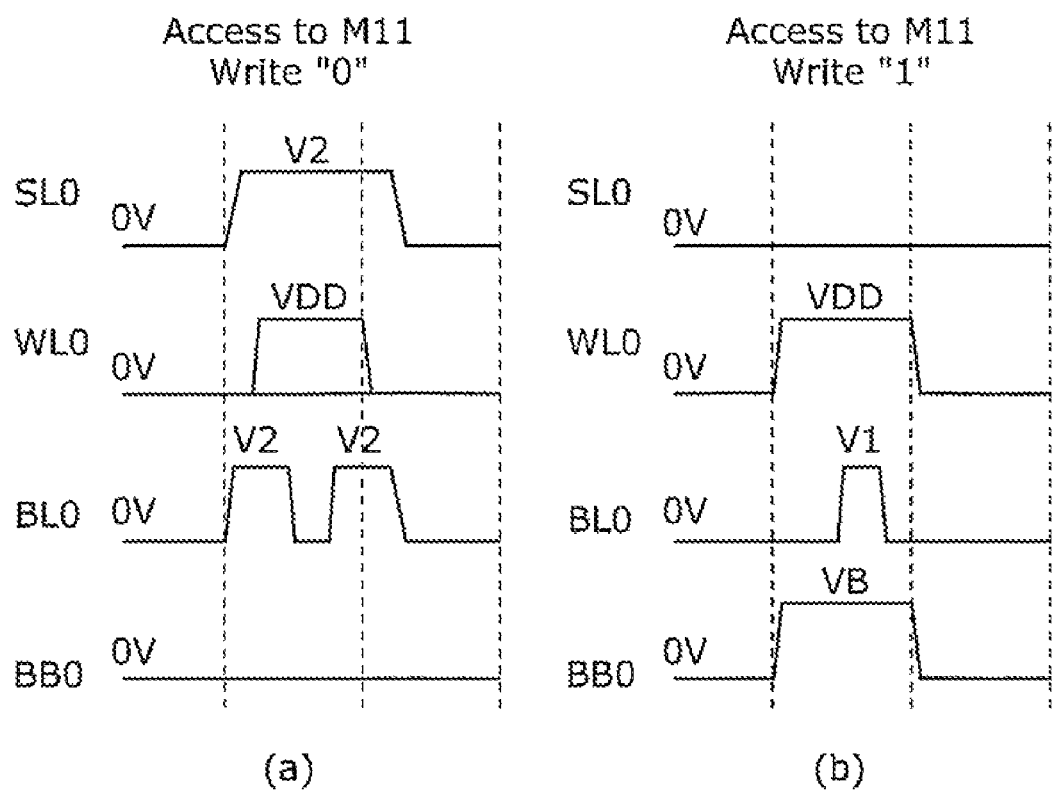
FIGS. 14(a) and (b) is a timing diagram showing an operation example of a nonvolatile storage device according to Embodiment 4 of the present invention.

FIGS. 14(a) and (b) is a timing diagram showing an operation example of the nonvolatile storage device according to Embodiment 4 of the present invention. Described here is the operation example in the case where the data "0" (in the case of the LR writing; FIG. 14(a)) or the data "1" (in the case of the HR writing; FIG. 14(b)) is written into the memory cell M11.

As shown in FIG. 14(b), the operation in the case of the data "1" writing (in the case of the HR writing) is the same as the operation described above in Embodiment 1 with reference to FIG. 7(b). On the other hand, as shown in FIG. 14(a), in the case of the data "0" writing (the LR writing), the bias voltage VB is not applied to a transistor, unlike FIG. 7(a). In other words, in the case of the LR writing, the same operation as the conventional operation is performed.

As described above, it is possible to increase the value of "voltage for HR writing/voltage for LR writing" by causing the substrate bias circuit 220 to apply the forward substrate bias voltage only in the case of the HR writing but not in the case of the LR writing, in comparison to a case where such a procedure is not performed at all. With this, it is possible to stabilize the resistance value in the high resistance state, and achieve the stable operations of the nonvolatile storage device.

It is to be noted that it is preferable to perform the treatment in Embodiment 2 (that is, the application of the bias voltage to the source of the transistor included in the non-selected memory cell) on the non-selected memory cell, also at a time when the substrate bias voltage is applied in the present embodiment.

Further, in addition to the application of the substrate bias voltage in the present embodiment, the substrate bias voltage may be applied in the initialization process described in Embodiment 3.

(Embodiment 5)

Next, the following describes a nonvolatile storage device according to Embodiment 5 of the present invention.

In the case where a write process is unsuccessful for any reason, there is a chance that the write process is completed by performing additional writing through which the same data is written anew. In the nonvolatile storage device including variable resistance elements according to Embodiment 5, a change of a resistance state of a variable resistance element is stabilized by causing the substrate bias circuit 220 to apply a bias voltage to a substrate of a transistor in the additional write process.

Figure 15:
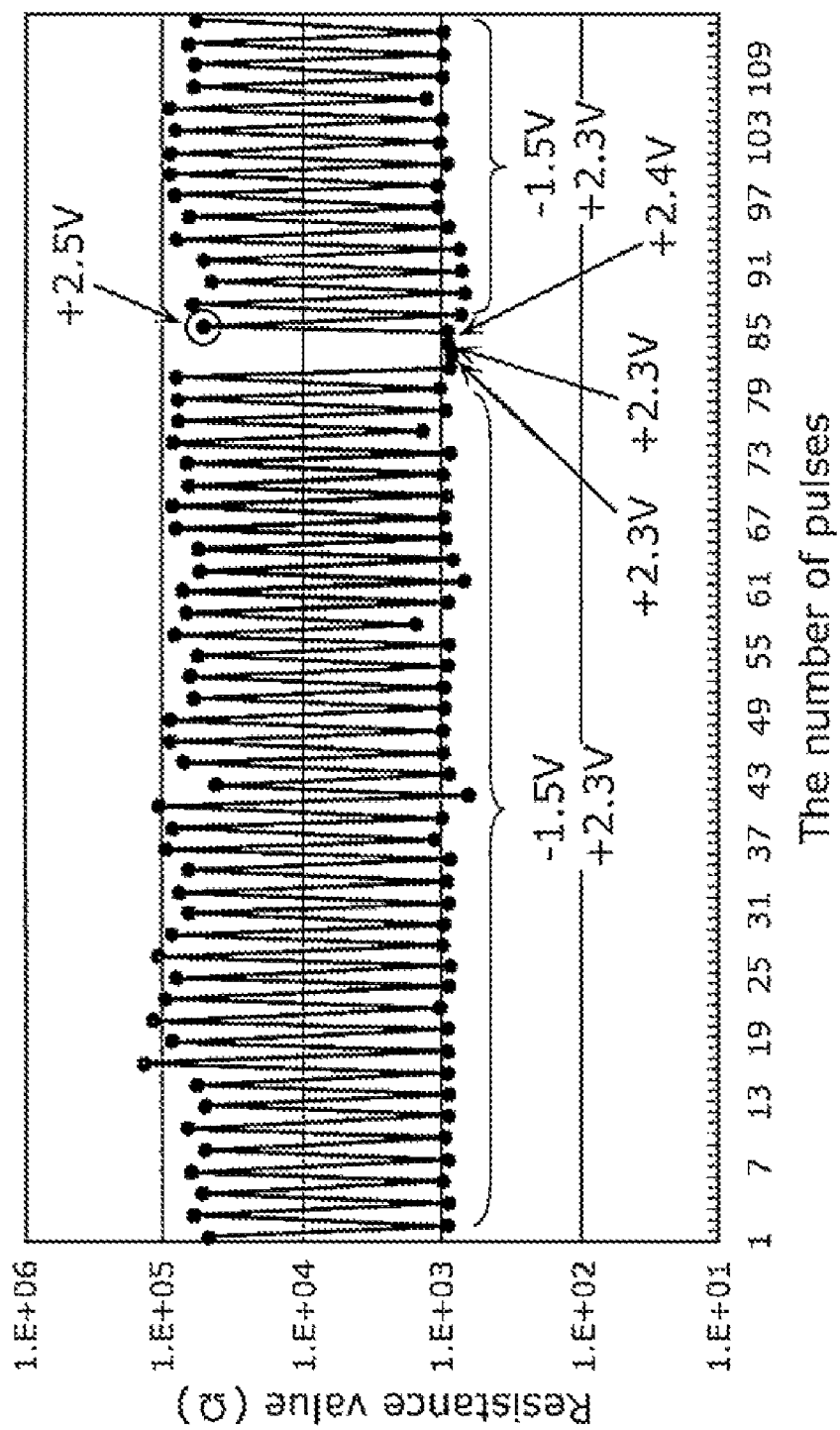
FIG. 15 is a graph showing a change of a resistance state caused by additional writing into a single variable resistance element in Embodiment 5 of the present invention.

FIG. 15 shows an example of write characteristics of a single variable resistance element. The LR writing and the HR writing are repeated with alternate pluses of −1.5 V and +2.3 V, but the HR writing is unsuccessful along the way as shown by spots where the low resistance state continues. As shown in FIG. 15, the LR state remains when +2.3 V normally used for the HR writing is applied two times and when +2.4 V is applied, but application of +2.5 V performs the HR writing in the same manner as the normal operation. After the HR writing succeeds with the application of +2.5 V, the resistance change occurs with the usual alternate pulses of −1.5 V and +2.3 V. It is possible to stabilize the resistance change by performing additional writing with a voltage to be applied that is little higher than a normal voltage, in the case where the resistance change is unsuccessful as stated above.

As a result, in Embodiment 5, a voltage higher than a voltage to be applied in normal writing is applied by causing the substrate bias circuit 220 to apply the forward substrate bias voltage only when the additional write process is performed, and thus the change of the resistance state of the variable resistance element is stabilized.

It is to be noted that a basic configuration of the nonvolatile storage device according to Embodiment 5 is the same as in the case of Embodiment 1 shown in FIG. 5, and thus the basic configuration is not described. Unlike the nonvolatile storage device according to Embodiment 1 which applies the substrate bias voltage in the normal write cycle, the nonvolatile storage device according to Embodiment 5 applies the substrate bias voltage only in the case of the additional writing. The following describes the above with reference to FIG. 5 as required.

As stated above, the nonvolatile storage device according to Embodiment 5 causes the substrate bias circuit 220 to apply the substrate bias voltage in the additional write process to be performed after the writing is unsuccessful. To put it differently, the write process in Embodiment 1 described with reference to FIGS. 7(a) and (b) is performed in the additional write process.

FIG. 16(a) is a flowchart showing a procedure of application of a substrate bias voltage which is a characteristic operation of the nonvolatile storage device according to the present embodiment. Described here is a procedure of a method for writing performed by the nonvolatile storage device according to the present invention.

First, under an instruction of the control circuit 210, a selection circuit (the row selection circuit 208 and the column selection circuit 203) selects at least one memory cell into which data is to be written from the memory cell array 202 (S40). Then, under control of the control circuit 210, the write circuit 206 provides a voltage pulse for writing data (e.g., "1") to the variable resistance element included in the memory cell selected by the selection circuit (the row selection circuit 208 and the column selection circuit 203) (S41). Next, the control circuit 210 causes the sense amplifier 204 to read the data stored in the memory cell, and determines (that is, verifies) whether or not the read data corresponds to most recently written data (S42).

Consequently, in the case where the read data corresponds to the most recently written data (Yes in S42), the writing is finished, but, in the case where the read data does not correspond to the most recently written data (No in S42), under the control of the control circuit 210, the write circuit 206 performs the writing using a voltage for writing again (S41) after making preparation for increasing the voltage for writing by a predetermined voltage (e.g., 0.1 V) so that the voltage for writing is higher than a recently applied voltage for writing (S43). Subsequently, the process for increasing the voltage for writing (S43) and the writing again (S41) are repeated until the writing succeeds (the verification is passed).

FIG. 16(b) is a flowchart showing a detailed procedure of the writing step (S41) shown in FIG. 16(a). The control circuit 210 determines whether or not writing is additional writing (S41a). In the case where the writing is the additional writing (Yes in S41a), the control circuit 210 first instructs the substrate bias circuit 220 to apply a substrate bias voltage (S41b), and then causes the write circuit 206 to perform the write cycle (the application of the voltage pulse for writing) (S41c). On the other hand, in the case where the writing is not the additional writing (the first writing) (No in S41a), the control circuit 210 simply causes the write circuit 206 to perform the write cycle (the application of the voltage pulse for writing) without causing the substrate bias circuit 220 to operate (S41c).

With this, in the case where the additional writing is performed on the variable resistance element after the writing for changing the resistance state of the variable resistance layer of the variable resistance element included in the memory cell selected in the selection step (S40) is unsuccessful, the forward bias voltage is applied to the semiconductor substrate (well) in which the transistor included in the memory cell is formed.

When the substrate bias voltage is applied in the additional writing, it is possible to increase an effective voltage to be applied to the variable resistance element as shown in FIG. 4. To put it differently, it is possible to produce the same effect as in the case where the voltage to be applied at the time of the additional writing is increased as shown in FIG. 15.

As described above, in the additional write process to be performed after the write process is unsuccessful, an additional writing pulse obtained through the application of the bias voltage performed by the substrate bias circuit is applied to the variable resistance element, and thus it is possible to stabilize the subsequent change of the resistance state of the variable resistance element. As a result, it is possible to realize the nonvolatile storage device which can operate stably.

It is to be noted that although the nonvolatile storage device according to the present embodiment applies the substrate bias voltage only in the additional writing, as in Embodiment 3, the nonvolatile storage device according to the present embodiment may apply the substrate bias voltage in the initialization process as well.

Moreover, in the additional writing, the treatment in Embodiment 2 (that is, the application of the bias voltage to the source of the transistor included in the non-selected memory cell) may be performed on the non-selected memory cell.

(Embodiment 6)

Next, the following describes a nonvolatile storage device according to Embodiment 6 of the present invention.

In the case of the nonvolatile storage device including variable resistance elements, when a write process is repeatedly performed, there is a chance that the resistance of the variable resistance elements does not change after a certain number of times the write process is performed. In order to prevent such a situation, when the write process is performed a predetermined number of times, it is preferable to apply a voltage higher than a voltage to be applied in the normal writing. Performing such a process (hereinafter, referred to as "refresh process") achieves the stable operations of the nonvolatile storage device.

The nonvolatile storage device according to Embodiment 6 performs the refresh process by causing the substrate bias circuit 220 to apply a forward substrate bias voltage.

It is to be noted that a basic configuration of the nonvolatile storage device according to Embodiment 6 is the same as in the case of Embodiment 1 shown in FIG. 5, and thus the basic configuration is not described. Unlike the nonvolatile storage device according to Embodiment 1 which applies the substrate bias voltage in all the write cycles, the nonvolatile storage device according to Embodiment 6 applies the substrate bias voltage only in the refresh process. The following describes the above with reference to FIG. 5 as required.

As stated above, the nonvolatile storage device according to Embodiment 6 causes the substrate bias circuit 220 to apply the forward substrate bias voltage in the refresh process. To put it differently, the write process in Embodiment 1 described with reference to FIG. 5 is performed in the refresh process. Such a refresh process is performed in the case where writing is performed a predetermined number of times such as 1 million times.

Figure 17:
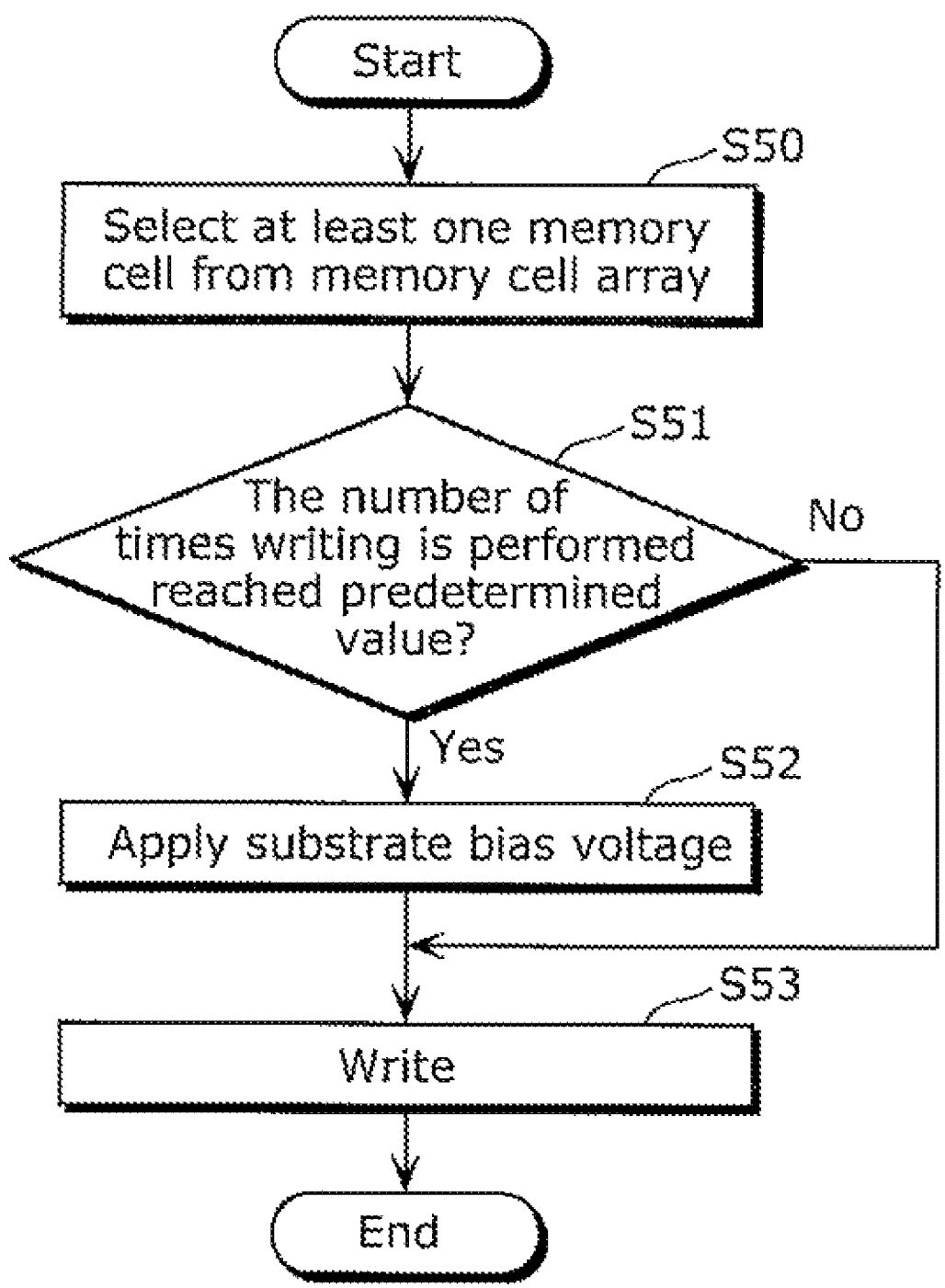
FIG. 17 is a flowchart showing an operation example of a nonvolatile storage device according to Embodiment 6 of the present invention.
Figure 18:
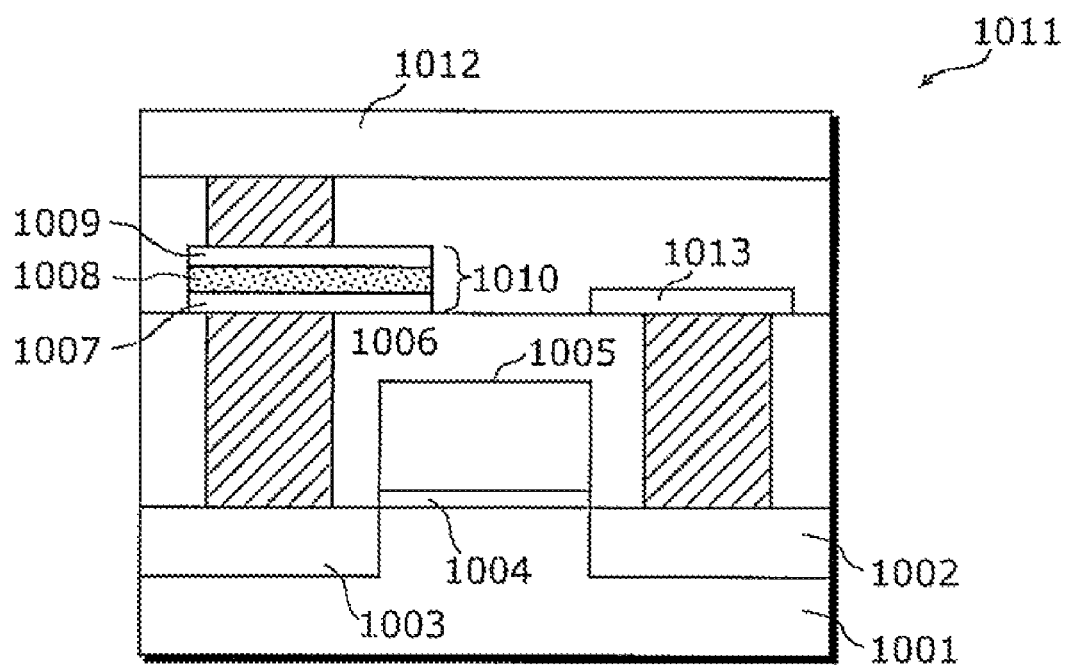
FIG. 18 is a schematic view showing a cross section of a conventional memory cell.

FIG. 17 is a flowchart showing a procedure of application of a substrate bias voltage which is a characteristic operation of the nonvolatile storage device according to the present embodiment. Described here is a procedure of a method for writing performed by the nonvolatile storage device according to the present invention.

First, under an instruction of the control circuit 210, a selection circuit (the row selection circuit 208 and the column selection circuit 203) selects at least one memory cell into which data is to be written from the memory cell array 202 (S50). Then, the control circuit 210 determines whether or not the write process had been performed has been performed a predetermined number of times (e.g., 1 million times), using a counter included in the control circuit 210 (S51). In the case where it is determined that the write process has been performed the predetermined number of times (Yes in S51), the control circuit 210 instructs the substrate bias circuit 220 to apply a substrate bias voltage (part of the refresh process) (S52), and then causes the write circuit 206 to perform the write cycle (application of a voltage pulse for writing) (S53). On the other hand, in the case where it is determined that the write process has not been performed the predetermined number of times (No in S51), the control circuit 210 simply causes the write circuit 206 to perform the write cycle (the application of the voltage pulse for writing) without causing the substrate bias circuit 220 to operate (S53). It is to be noted that after performing the refresh process (the application of the substrate bias voltage and the writing), the control circuit 210 resets the counter to zero, and performs the same processing (S51 to S53).

As described above, it is possible to increase the voltage to be applied to the element in the refresh process more than the voltage applied to the element in the normal write process by causing the substrate bias circuit 220 to apply the forward substrate bias voltage in the refresh process, and thus it is possible to avoid the situation where the resistance of the variable resistance elements does not change. With this, it is possible to realize the nonvolatile storage device which can operate stably.

It is to be noted that although the nonvolatile storage device according to the present embodiment applies the substrate bias voltage only in the refresh process, as in Embodiment 3, the nonvolatile storage device according to the present embodiment may apply the substrate bias voltage in the initialization process as well.

Moreover, the number of times the writing has been performed is counted and held for each of the memory cells, and the refresh process may be performed only on a memory cell in which the number of times the writing has been performed reaches a predetermined value, or the number of times the writing has been performed on the entire memory cell array 202 is counted and held, and the refresh process may be performed on all of the memory cells included in the memory cell array 202 when the number of times the writing has been performed reaches the predetermined value.

Further, in the case where the refresh process is performed for each memory cell, it is preferable to perform, in the refresh process, the treatment in Embodiment 2 (that is, the application of the bias voltage to the source of the transistor included in the non-selected memory cell) on the non-selected memory cell.

(Other Embodiments)

Although each of the above embodiments has describes the case where the variable resistance layer 104 has the stacked structure of the tantalum oxide layers, the present invention is not limited to the stacked structure of the tantalum oxide layers. The variable resistance layer 104 may be a layer which shows a resistance change caused by application of a voltage between the upper electrode 105 and the lower electrode 103. Thus, for example, the variable resistance layer 104 may have a structure of a single tantalum oxide layer or may be not the tantalum oxide layer but another metal oxide layer such as a hafnium oxide layer and a zirconium oxide layer. It is to be noted that even in the case where the hafnium oxide layer or the zirconium oxide layer is used, in the same manner as in the above-described embodiments, it is preferable to for a stacked structure of a first oxide layer and a second oxide layer each of which has a different oxygen content percentage.

Although the various embodiments have been described, various modifications conceived by those skilled in the art may be made to each embodiment, or the components and the functions in each embodiment may be combined accordingly, within the scope of the present invention. For instance, as stated above, Embodiments 3 and 6 may be combined, so that the substrate bias circuit 220 applies the bias voltage in both the initialization process and the refresh process, and so on. With this, it is possible to realize a nonvolatile storage device which can maintain stable operations for a longer period of time.

INDUSTRIAL APPLICABILITY

A nonvolatile storage device according to the present invention is useful as a storage device or the like used for various electronic devices such as a personal computer and a mobile phone, and especially as a nonvolatile memory with a large storage capacity.

REFERENCE SINGS LIST

100 Variable resistance element
101 Substrate
102 Oxide layer
103 Lower electrode
104 Variable resistance layer
104a First tantalum oxide layer
104b Second tantalum oxide layer
105 Upper electrode
106 Pattern
107 Element region
200 Nonvolatile storage device
201 Memory main body
202 Memory cell array
203 Column selection circuit
204 Sense amplifier
205 Data input and output circuit
206 Write circuit
207 Row driver
208 Row selection circuit
209 Address input circuit
210 Control circuit
211 Power source for writing
212 Power source for LR writing
213 Power source for HR writing
220 Substrate bias circuit
301 Semiconductor substrate
301a P-type well (P-type diffusion layer)
302a First N-type diffusion layer region
302b Second N-type diffusion layer region
303a Gate insulator film
303b Gate electrode
304 First via
305 First wiring layer
306 Second via
307 Second wiring layer
308 Third via
309 Variable resistance element
309a Lower electrode
309b Variable resistance layer
309b-1 First tantalum oxide layer
309b-2 Second tantalum oxide layer
309c Upper electrode
310 Fourth via
311 Third wiring layer
317 Transistor
BL0, BL1, . . . Bit line
N11, N12, . . . Transistor
M11, M12, . . . Memory cell
SL0, SL2, . . . Source line
R11, R12, . . . Variable resistance element
WL0, WL1, . . . Word line

The invention claimed is:

1. A nonvolatile storage device comprising:
a semiconductor substrate which has a region of a first conductivity type;
a memory cell array which includes memory cells each of which includes a variable resistance element and a transistor that are connected in series and formed above said semiconductor substrate;
a selection circuit which selects, from among said memory cells included in said memory cell array, at least one memory cell by applying a voltage pulse to a gate of said transistor included in said at least one memory cell;
a write circuit which applies a voltage pulse for writing to said variable resistance element included in said at least one memory cell selected by said selection circuit, via said transistor included in said at least one memory cell; and
a substrate bias circuit which applies a first bias voltage to said semiconductor substrate,
wherein said variable resistance element included in each of said memory cells includes: a first electrode; a second electrode; and a variable resistance layer which is interposed between said first and second electrodes and whose resistance state reversibly changes between a low resistance state and a high resistance state based on a voltage pulse applied between said first and second electrodes,
said transistor included in each of said memory cells is formed within the region of the first conductivity type of said semiconductor substrate, and includes: a first diffusion region of a second conductivity type; the gate; and a second diffusion region of the second conductivity type, the second conductivity type having a polarity which is reverse to a polarity of the first conductivity type, and
said substrate bias circuit applies, to said region of the first conductivity type of said semiconductor substrate, the first bias voltage in a forward direction with respect to said first and second diffusion regions, when said write circuit applies the voltage pulse for writing between said first and second electrodes included in said variable resistance element included in said at least one memory cell selected by said selection circuit.

2. The nonvolatile storage device according to claim 1, wherein said substrate bias circuit applies the first bias voltage in the case where a resistance value of said variable resistance layer is an initial resistance value that is a resistance value when a voltage pulse has not yet been applied since said variable resistance element is manufactured, said variable resistance layer being included in said variable resistance element included in said at least one memory cell selected by said selection circuit.

3. The nonvolatile storage device according to claim 1, wherein said substrate bias circuit applies the first bias voltage in the case where the resistance state of said variable resistance layer is changed from the low resistance state to the high resistance state, said variable resistance layer being included in said variable resistance element included in said at least one memory cell selected by said selection circuit.

4. The nonvolatile storage device according to claim 1, wherein said substrate bias circuit applies the first bias voltage in the case where additional writing is performed on said variable resistance element after writing for changing the resistance state of said variable resistance layer is unsuccessful, said variable resistance layer being included in said variable resistance element included in said at least one memory cell selected by said selection circuit.

5. The nonvolatile storage device according to claim 1, wherein said substrate bias circuit applies the first bias voltage in the case where writing has been performed on said variable resistance element a predetermined number of times, said variable resistance element being included in said at least one memory cell selected by said selection circuit.

6. The nonvolatile storage device according to claim 1, wherein the region of the first conductivity type of said semiconductor substrate is a well of the first conductivity type formed in said semiconductor substrate, and said substrate bias circuit applies the first bias voltage to the well.

7. The nonvolatile storage device according to claim 1, further comprising
a source line bias circuit which applies, to a source of a transistor included in a memory cell not selected by said selection circuit, a second bias voltage for suppressing a current flowing through the transistor.

8. The nonvolatile storage device according to claim 1, wherein said variable resistance layer includes a metal oxide in which the resistance state reversibly changes between the low resistance state and the high resistance state based on the voltage pulse applied between said first and second electrodes.

9. The nonvolatile storage device according to claim 8, wherein the metal oxide has a stacked structure including a first metal oxide layer and a second metal oxide layer which has a higher oxygen content percentage than the first metal oxide layer has.

10. The nonvolatile storage device according to claim 9, wherein the metal oxide is formed by stacking a first tantalum oxide layer as the first metal oxide layer and a second tantalum oxide layer as the second metal oxide layer which has a higher oxygen content percentage than the first tantalum oxide layer has.

11. The method for writing according to claim 1, wherein, in said applying of a first bias voltage, the first bias voltage is applied in the case where writing has been performed on the variable resistance element a predetermined number of times, the variable resistance element included in the at least one memory cell selected in said selecting.

12. A method for writing into a memory cell of a nonvolatile storage device, said method comprising:
selecting at least one memory cell from a memory cell array including memory cells each of which includes a variable resistance element and a transistor that are connected in series and formed above a semiconductor substrate having a region of a first conductivity type;
applying, via the transistor included in the at least one memory cell selected in said selecting, a voltage pulse for writing to the variable resistance element included in the at least one memory cell; and
applying a first bias voltage to the semiconductor substrate, wherein, in said applying of a first bias voltage, when the voltage pulse for writing is applied, in said applying of a voltage pulse for writing, between the first and second electrodes, the first bias voltage is applied, in a forward direction with respect to a first diffusion region of a second conductivity type and a second diffusion region of the second conductivity type, to the region of the first conductivity type of the semiconductor substrate on which the transistor included in the at least one memory cell is formed, the first and second electrodes being included in the variable resistance element included in the at least one memory cell selected in said selecting, the first and second diffusion regions being included in the transistor included in the at least one memory cell, and the second conductivity type having a polarity which is reverse to a polarity of the first conductivity type.

13. The method for writing according to claim 12, wherein, in said applying of a first bias voltage, the first bias voltage is applied in the case where a resistance value of a variable resistance layer is an initial resistance value that is a resistance value when a voltage pulse has not yet been applied since the variable resistance element is manufactured, the variable resistance layer being included in the variable resistance element included in the at least one memory cell selected in said selecting.

14. The method for writing according to claim 12, wherein, in said applying of a first bias voltage, the first bias voltage is applied in the case where a resistance state of a variable resistance layer is changed from a low resistance state to a high resistance state, the variable resistance layer being included in the variable resistance element included in the at least one memory cell selected in said selecting.

15. The method for writing according to claim 12, wherein, in said applying of a first bias voltage, the first bias voltage is applied in the case where additional writing is performed on the variable resistance element after writing for changing a resistance state of a variable resistance layer is unsuccessful, the variable resistance layer being included in the variable resistance element included in the at least one memory cell selected in said selecting.

* * * * *